US012366617B2

(12) United States Patent
Shi et al.

(10) Patent No.: US 12,366,617 B2
(45) Date of Patent: *Jul. 22, 2025

(54) MONOLAYER TRANSITION METAL DICHALCOGENIDES HAVING GIANT VALLEY-POLARIZED RYDBERG EXCITONS REVEALED BY MAGNETO-PHOTOCURRENT SPECTROSCOPY

(71) Applicant: RENSSELAER POLYTECHNIC INSTITUTE, Troy, NY (US)

(72) Inventors: Sufei Shi, Albany, NY (US); Tianmeng Wang, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/432,511

(22) Filed: Feb. 5, 2024

(65) Prior Publication Data
US 2024/0175949 A1 May 30, 2024

Related U.S. Application Data

(63) Continuation of application No. 17/565,806, filed on Dec. 30, 2021, now Pat. No. 11,892,529.
(Continued)

(51) Int. Cl.
*G01R 33/20* (2006.01)
*G01J 4/00* (2006.01)
(Continued)

(52) U.S. Cl.
CPC ............... *G01R 33/20* (2013.01); *G01J 4/00* (2013.01); *H10D 30/6757* (2025.01); *H10D 62/80* (2025.01)

(58) Field of Classification Search
CPC . G01R 33/20; G01J 4/00; H01L 29/24; H01L 29/78696; H01L 29/518;
(Continued)

(56) References Cited

U.S. PATENT DOCUMENTS 9,245,810 B2 1/2016 Dale et al.
9,608,101 B2 3/2017 Kis et al.
(Continued)

FOREIGN PATENT DOCUMENTS

CN 112484666 B 10/2021
EP 3930229 A1 12/2012
(Continued)

*Primary Examiner* — G. M. A. Hyder
(74) *Attorney, Agent, or Firm* — Barclay Damon LLP; Anthony P. Gangemi

(57) ABSTRACT

A transition metal dichalcogenides device includes a substrate, at least one layer of boron nitride, a tungsten diselenide monolayer positioned such that the at least one layer of boron nitride at least partially encapsulates the tungsten diselenide monolayer, and a plurality of electrodes. Each of the plurality of electrodes includes gold and few-layer graphene, and the at least one layer of boron nitride includes hexagonal few-layer boron nitride. The tungsten diselenide monolayer is configured to reveal excitons when at least one of a K valley and a K' valley of the tungsten diselenide monolayer is exposed to excitation photon energy and an external magnetic field. The excitons are giant valley-polarized Rydberg excitons in excited states ranging from 2 s to 11 s when the external magnetic field is in the range of about −17 T to about 17 T.

19 Claims, 18 Drawing Sheets

Related U.S. Application Data

(60) Provisional application No. 63/154,876, filed on Mar. 1, 2021.

(51) Int. Cl.
*H10D 30/67* (2025.01)
*H10D 62/80* (2025.01)

(58) Field of Classification Search
CPC .............. H01L 29/267; H01L 29/778; H01L 29/78681; G06N 10/40
See application file for complete search history.

(56) References Cited

U.S. PATENT DOCUMENTS

| | | |
|---|---|---|
| 9,680,038 B2 | 6/2017 | Zhong et al. |
| 9,934,469 B1 | 4/2018 | Jau et al. |
| 9,970,972 B2 | 5/2018 | Baicry et al. |
| 10,319,825 B2 | 6/2019 | Terrones et al. |
| 10,504,033 B1 | 12/2019 | King et al. |
| 10,677,953 B2 | 6/2020 | Stetson et al. |
| 2018/0218279 A1 | 8/2018 | Lechner et al. |
| 2019/0187198 A1 | 6/2019 | Anderson et al. |
| 2019/0288160 A1 | 9/2019 | Atature et al. |
| 2020/0116623 A1 | 4/2020 | Cooper-Roy et al. |
| 2020/0203323 A1* | 6/2020 | Suixianq Li ............ H01L 33/26 |

FOREIGN PATENT DOCUMENTS

| | | |
|---|---|---|
| JP | 2021507271 A | 2/2021 |
| WO | 2020132152 A1 | 6/2020 |
| WO | 2021003580 A1 | 1/2021 |
| WO | 2021243260 A1 | 12/2021 |

* cited by examiner

MONOLAYER TRANSITION METAL DICHALCOGENIDES HAVING GIANT VALLEY-POLARIZED RYDBERG EXCITONS REVEALED BY MAGNETO-PHOTOCURRENT SPECTROSCOPY

CROSS REFERENCE TO RELATED APPLICATION(S)

This application is a continuation application, and claims the priority benefit, of U.S. patent application Ser. No. 17/565,806, filed Dec. 30, 2021, which claims the priority benefit of U.S. Provisional Patent Application No. 63/154,876, filed Mar. 1, 2021, the contents of which are incorporated by reference herein as if disclosed in their entireties.

STATEMENT REGARDING FEDERALLY SPONSORED RESEARCH AND DEVELOPMENT

The present invention was made with government support under Grant No. FA9550-18-1-0312 awarded by the United States Air Force Office of Scientific Research. The government has certain rights in the invention.

FIELD

The present technology generally relates to the area of Rydberg atoms, and more particularly, to monolayer transition metal dichalcogenides configured to reveal giant valley-polarized Rydberg excitons.

BACKGROUND

The Rydberg atom, with its large size of hundreds of nanometers, can be easily controlled and probed with light. As a result, the Rydberg atom can be used to generate artificial molecules to study molecular dynamics. The giant size of Rydberg atoms also results in an enhanced interaction that leads to large nonlinearity and an exciton Coulomb blockade, which can be utilized for quantum information processing and quantum simulation. Despite the significant experimental progress for creating a Rydberg atom in optical traps, its analogue in a solid-state system is still highly desirable for better integration into modern electronic technology. The exciton, a ubiquitous quasiparticle in optically excited semiconductors, consists of a negatively charged electron and a positively charged hole bound together through a Coulomb interaction. In bulk semiconductors, excitons would also have Rydberg series like the hydrogen atom, which has been identified by the serial absorption peaks below the bandgap with energy spacing matching the Rydberg description $$E_b = -\frac{R_y}{n^2},$$

where $E_b$ is the binding energy, $R_y$ is the Rydberg constant, and n is the principal quantum number. For large principal number n, the corresponding Rydberg exciton would have a large radius extension and thus strongly enhanced exciton-exciton interaction, which is critical for realizing the large optical nonlinearity needed for quantum optoelectronics. One such example is the Rydberg blockade that can be utilized for quantum computing and quantum sensing, in which the existence of a large size Rydberg exciton will exclude the possibility of another Rydberg exciton nearby. The Rydberg exciton blockade has been shown for an n=25 exciton found in the crystal of copper oxide, which has a corresponding Bohr radius of 1.04 µm.

The ordered array of Rydberg excitons can be utilized as a quantum simulator and for quantum computing as well. However, generating such an ordered array in a bulk semiconductor is extremely challenging, if feasible at all. The emergence of the monolayer transition metal dichalcogenides ("TMDC") provides a promising platform to address the challenge. The strongly enhanced Coulomb interaction in two dimensions leads to a robust exciton with a large binding energy, which renders the highly excited stated of the exciton possible. The two-dimensional ("2D") nature of the TMDCs allows them to be patterned with periodic potential to form an ordered array of Rydberg excitons. Also, the valley degrees of freedom of the exciton brings additional control of the Rydberg exciton. Nevertheless, the existence of a giant Rydberg exciton with a size comparable to the optical wavelength remains elusive. So far, only an excited exciton state up to 5 s has been revealed in TMDCs, which requires an extremely strong magnetic field (~91 T) and is still too small for convenient optical readout.

Thus, a need exists for a TMDC having higher-order Rydberg excitons that addressed the problems described above.

SUMMARY

According to an embodiment of the present technology, a transition metal dichalcogenides device is provided. The device includes a substrate, a bottom layer of boron nitride, a tungsten diselenide monolayer positioned on the bottom layer of boron nitride, a top layer of boron nitride positioned on the tungsten diselenide monolayer such that the bottom layer of boron nitride and the top layer of boron nitride at least partially encapsulate the tungsten diselenide monolayer, a source electrode positioned on the substrate, a drain electrode positioned on the substrate, and a top gate electrode positioned on the top layer of boron nitride.

In some embodiments, the source electrode and the drain electrode each include gold and few-layer graphene.

In some embodiments, the few-layer graphene is positioned between the bottom layer of boron nitride and the top layer of boron nitride and partially on top of the tungsten diselenide monolayer.

In some embodiments, the top gate electrode includes gold and few-layer graphene.

In some embodiments, at least one of the bottom layer of boron nitride and the top layer of boron nitride includes hexagonal few-layer boron nitride.

In some embodiments, the substrate includes at least one of a silicon dioxide layer and a silicon layer.

In some embodiments, the tungsten diselenide monolayer is configured to reveal excitons when at least one of a K valley and a K' valley of the tungsten diselenide monolayer is exposed to excitation photon energy and an external magnetic field.

In some embodiments, the excitons are giant valley-polarized Rydberg excitons in excited states ranging from 2 s to 11 s when the external magnetic field is in the range of about −17 T to about 17 T.

According to another embodiment of the present technology, a system for revealing excitons in a transition metal dichalcogenides is provided. The system includes a broadband light source configured to emit excitation photon energy, a tunable filter configured to filter to excitation photon energy to a predetermined wavelength bandwidth, a linear polarizer configured to linearly polarize the filtered excitation photon energy, a quarter waveplate configured to convert the linearly polarized excitation photon energy into circularly polarized excitation photon energy, and a focusing element configured to focus the circularly polarized excitation photon energy to excite the transition metal dichalcogenides positioned on a piezo stage microscope. An external magnetic field is applied to the transition metal dichalcogenides when it is exposed to the focused circularly polarized excitation photon energy.

In some embodiments, the system includes a mechanical chopper positioned between the linear polarizer and the quarter waveplate, and a lock-in amplifier configured to measure a photocurrent modulated by the mechanical chopper.

In some embodiments, the system includes a half waveplate positioned between the linear polarizer and the quarter waveplate.

In some embodiments, the broadband light source includes a supercontinuum laser.

In some embodiments, the focusing element includes a 50× objective configured to focus the circularly polarized excitation photon energy to a spot size of about 2 μm.

In some embodiments, the predetermined wavelength bandwidth is about 1 nm.

In some embodiments, the transition metal dichalcogenides includes a substrate, a bottom layer of boron nitride, a tungsten diselenide monolayer positioned on the bottom layer of boron nitride, a top layer of boron nitride positioned on the tungsten diselenide monolayer such that the bottom layer of boron nitride and the top layer of boron nitride at least partially encapsulate the tungsten diselenide monolayer, a source electrode positioned on the substrate, a drain electrode positioned on the substrate, and a top gate electrode positioned on the top layer of boron nitride.

In some embodiments, the tungsten diselenide monolayer is configured to reveal excitons when at least one of a K valley and a K' valley of the tungsten diselenide monolayer is exposed to the focused circularly polarized excitation photon energy and the external magnetic field.

In some embodiments, the excitons are giant valley-polarized Rydberg excitons in excited states ranging from 2 s to 11 s when the external magnetic field is in the range of about −17 T to about 17 T.

According to another embodiment of the present technology, a method of revealing excitons in a transition metal dichalcogenides is provided. The method includes the steps of providing the transition metal dichalcogenides, the transition metal dichalcogenides including a substrate, a bottom layer of boron nitride, a tungsten diselenide monolayer positioned on the bottom layer of boron nitride, a top layer of boron nitride positioned on the tungsten diselenide monolayer such that the bottom layer of boron nitride and the top layer of boron nitride at least partially encapsulate the tungsten diselenide monolayer, a source electrode positioned on the substrate, a drain electrode positioned on the substrate, and a top gate electrode positioned on the top layer of boron nitride; exposing the transition metal dichalcogenides to an external magnetic field; emitting excitation photon energy from a broadband light source; filtering, via a tunable filter, the excitation photon energy to a predetermined wavelength bandwidth; linearly polarizing, via a linear polarizer, the filtered excitation photon energy; converting, via a quarter waveplate, the linearly polarized excitation photon energy to circularly polarized excitation photon energy; and focusing, via a 50× objective, the circularly polarized excitation photon energy to a spot size of about 2 μm onto the tungsten diselenide monolayer of the transition metal dichalcogenides.

In some embodiments, the tungsten diselenide monolayer is configured to reveal excitons when at least one of a K valley and a K' valley of the tungsten diselenide monolayer is exposed to the focused circularly polarized excitation photon energy and the external magnetic field.

In some embodiments, the excitons are giant valley-polarized Rydberg excitons in excited states ranging from 2 s to 11 s when the external magnetic field is in the range of about −17 T to about 17 T.

According to yet another embodiment of the present technology, a transition metal dichalcogenides device is provided. The device includes a substrate, at least one layer of boron nitride, a tungsten diselenide monolayer positioned such that the at least one layer of boron nitride at least partially encapsulates the tungsten diselenide monolayer, and a plurality of electrodes.

In some embodiments, the plurality of electrodes includes a source electrode positioned on the substrate, a drain electrode positioned on the substrate, and a top gate electrode positioned on a top layer of the at least one layer of boron nitride.

In some embodiments, each of the source electrode, drain electrode, and top gate electrode include gold and few-layer graphene.

Further objects, aspects, features, and embodiments of the present technology will be apparent from the drawing figures and below description.

DETAILED DESCRIPTION

Accordingly, embodiments of the present technology are directed to a monolayer transition metal dichalcogenides ("TMDC") device and helicity-resolved magneto-photocurrent spectroscopy systems and methods to reveal the exciton excited states up to 11 s in the TMDC under an ~17 T magnetic field. Under an out-of-plane magnetic field, the energy degeneracy of the K and K' valleys is lifted, which can be exploited to improve the signal-to-noise ratio further. The extensive information about the size and energy of the Rydberg series of the exciton, from 1 s to 11 s, is in excellent agreement with numerical simulations using the non-hydrogenic screened Keldysh potential. In some embodiments, being able to resolve the highly excited state up to 11 s permits the accurate determination of the exciton binding energy of the A exciton (1 s) in $WSe_2$ to be 168.6 meV. Notably, in some embodiments, the size of the 11 s exciton is determined to be 214 nm, orders of magnitude larger than that of the ground-state exciton (1.75 nm for the 1 s state, see Table 1 below) and comparable to the wavelength of light, especially with the consideration of the dielectric environment. The unveiling of the valley-polarized giant Rydberg excitons in the TMDCs of the present technology enables further investigation of the enhanced exciton-exciton interactions. In addition, the two orders of magnitude difference of the binding energy between different Rydberg excitons allows the investigation of the interplay between the Coulomb interaction and Landau quantization, which transitions from a low- to high-magnetic-field limit for increasing n. In some embodiments, the high-magnetic-field limit can be reached at a reasonable magnetic field of ~10 T for n≥9, owing to the small binding energy of the high-order Rydberg exciton (Table 1).

TABLE 1

Binding energy and radius for each Rydberg exciton state at B = 0 T, obtained by fitting the experimental data with the numerical calculations

| Excited States | Binding Energy (meV) | Radius (nm) $r_{ns} = \sqrt{\langle r^2 \rangle_{ns}}$ |
|---|---|---|
| 1s | 168.6 | 1.75 |
| 2s | 40.0 | 6.80 |
| 3s | 17.4 | 15.45 |
| 4s | 9.7 | 27.68 |
| 5s | 6.1 | 43.51 |
| 6s | 4.2 | 62.94 |
| 7s | 3.1 | 85.96 |
| 8s | 2.4 | 112.6 |
| 9s | 1.9 | 142.9 |
| 10s | 1.5 | 176.7 |
| 11s | 1.2 | 214.0 |

Figure 1A:
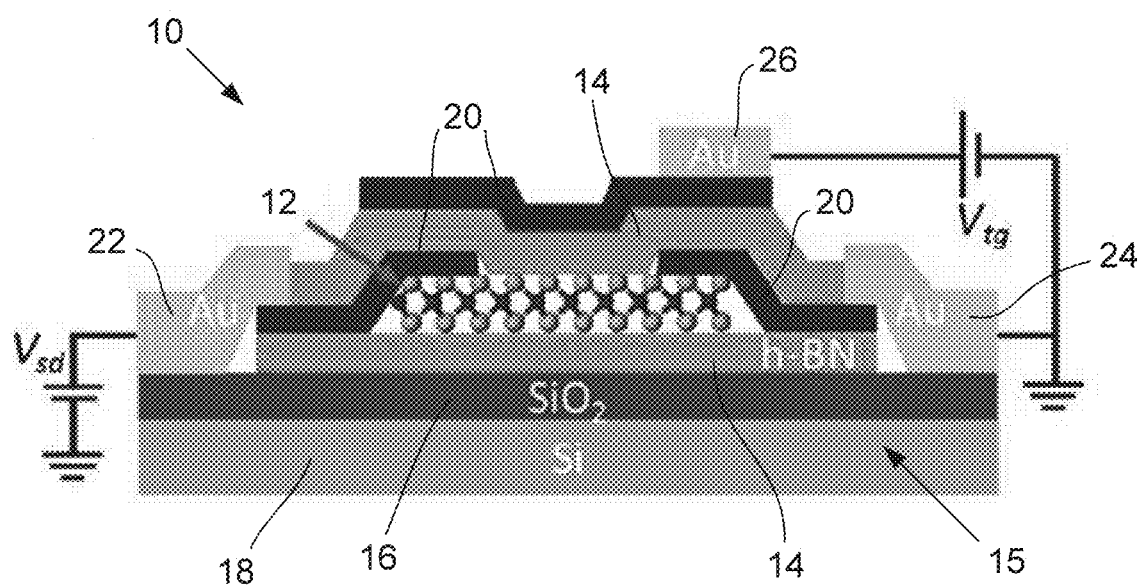
FIG. 1A is a schematic view of the TMDC device according to an exemplary embodiment of the present technology.
Figure 1B:
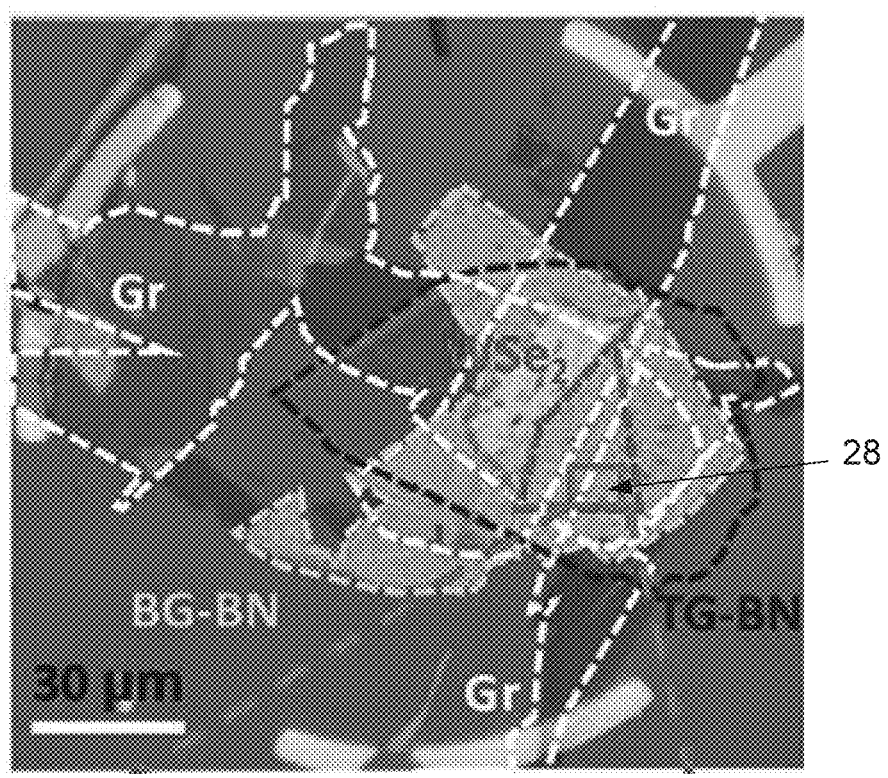
FIG. 1B is an optical microscope image of the TMDC of FIG. 1A.

FIG. 1A shows a TMDC 10 according to an exemplary embodiment of the present technology. The TMDC 10 has a monolayer tungsten diselenide ("$WSe_2$") 12 at least partially encapsulated by one or more boron nitride ("BN") layers 14 on a substrate 15. In some embodiments, the monolayer $WSe_2$ 12 is encapsulated by a bottom BN layer 14 and a top BN layer 14. In some embodiments, the BN layers 14 are formed of hexagonal few-layer boron nitride ("h-BN"). In some embodiments, the substrate 15 includes a silicon dioxide ("$SiO_2$") layer 16. In some embodiments, the substrate 15 includes a silicon ("Si") layer 18. In some embodiments, the substrate 15 includes a silicon dioxide layer 16 on top of a silicon layer 18. In some embodiments, few-layer graphene 20 is used as the source electrode 22 and drain electrode 24 of the $WSe_2$ layer 12, and few-layer graphene 20 is used as the top gate electrode 26, gating the monolayer $WSe_2$ 12 through the top BN layer 14. FIG. 1B shows an optical microscope image of the TMDC 10.

Figure 1C:
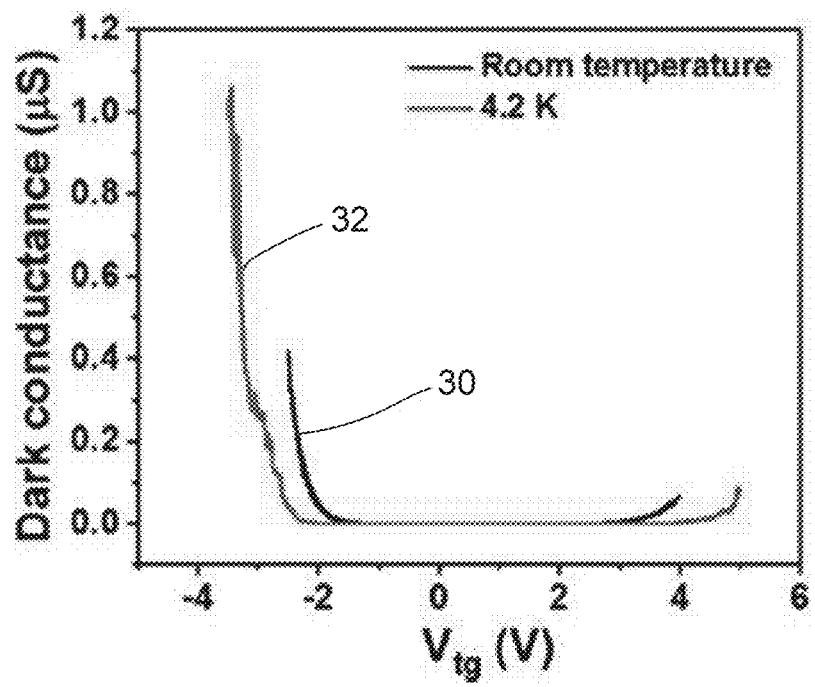
FIG. 1C is a chart showing the source-drain current of the TMDC of FIG. 1A as a function of the top gate voltage.
Figure 1D:
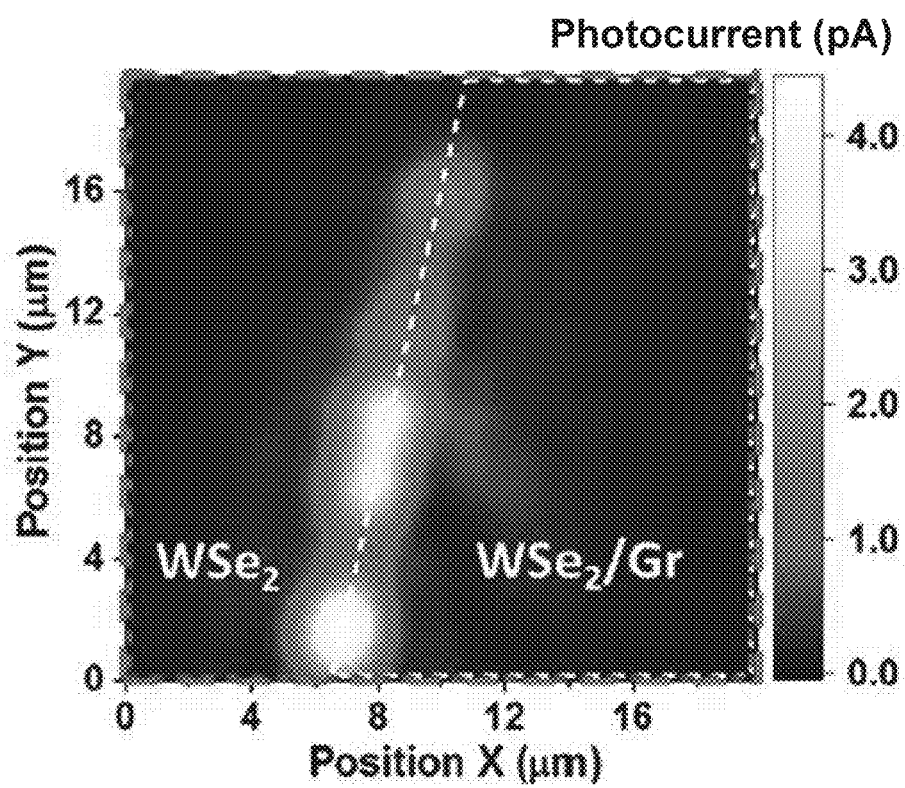
FIG. 1D is a spatially resolved photocurrent image of the boxed region of the TMDC of FIG. 1B.

In some embodiments, the conductance (i.e. the source-drain current) of the TMDC 10, without light illumination, was measured as a function of the top gate voltage $V_{tg}$ (with an applied bias of 100 mV) at both room temperature (curve labeled 30) and 4.2 K (curve labeled 32), as shown in FIG. 1C. As shown, the TMDC 10 exhibits bipolar behavior and is charge neutral at the gate voltage of 0 V. In some embodiments, spatially resolved photocurrent measurement at 77 K with zero bias voltage applied was performed by scanning a focused laser spot (~2 μm) across the boxed region 28 of the TMDC 10 shown on FIG. 1B, and the resulting photocurrent response as a function of the spatial location of the laser spot was measured, as shown in FIG. 1D. As shown, the photocurrent response at zero bias is mainly from the junction of the few-layer graphene electrode (denoted WSe$_2$/Gr) and the monolayer WSe$_2$, with a photoresponsivity as large as 4.4 µA/W, with the continuous wave ("CW") photoexcitation centered at 1.959 eV and an excitation power of 1 µW.

Figure 2A:
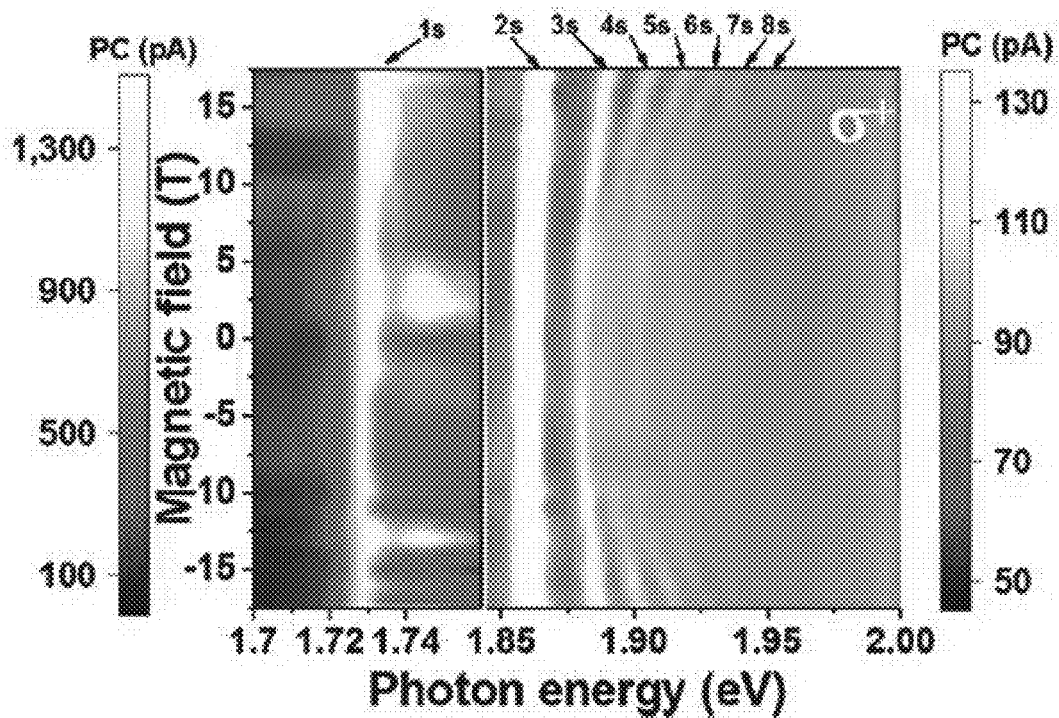
FIG. 2A is a chart showing the photocurrent response of the TMDC as a function of the excitation photon energy and magnetic field for the $\sigma^+$ photoexcitation (K valley).
Figure 2B:
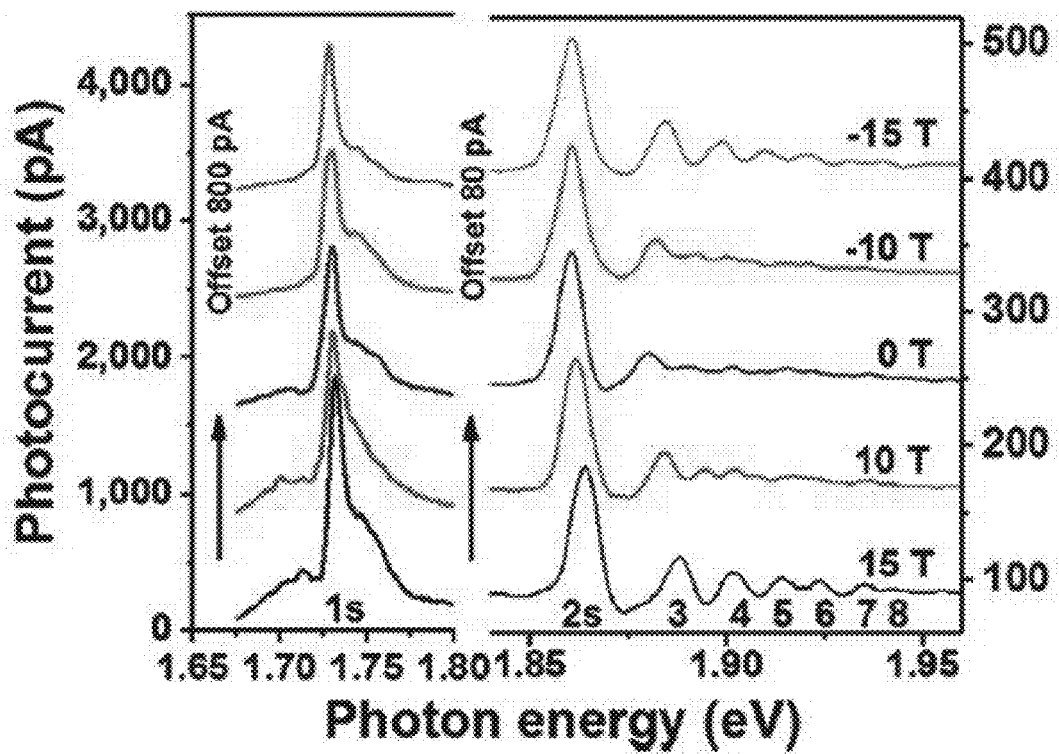
FIG. 2B is a chart showing the photocurrent response of the TMDC as a function of the excitation photon energy for different exemplary magnetic fields.
Figure 6A:
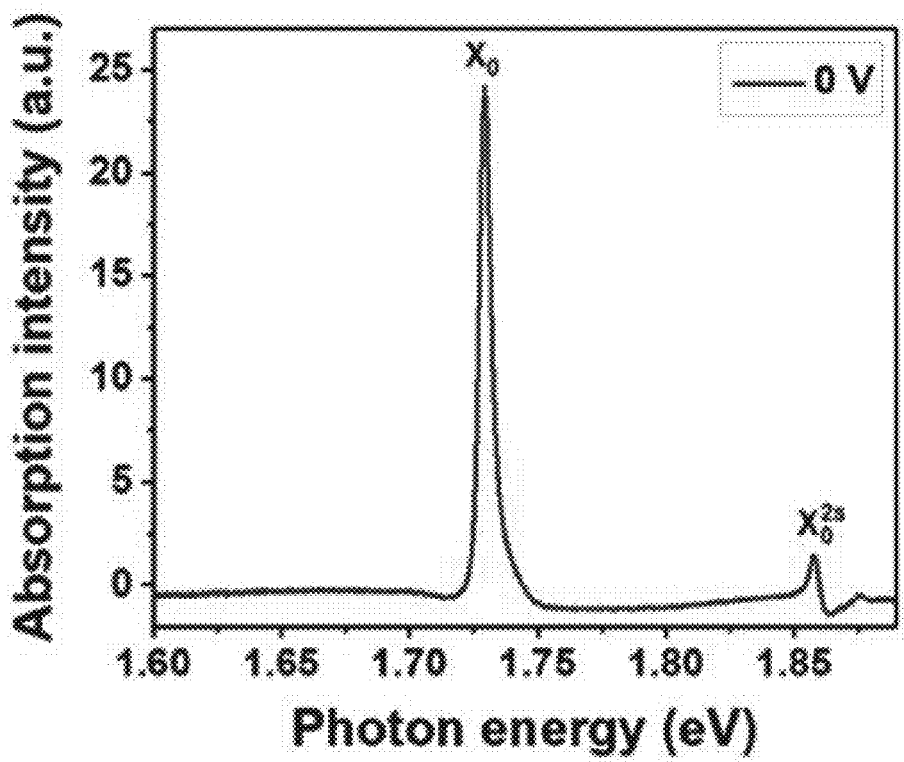
FIG. 6A is a chart showing the absorption spectrum of the TMDC at the gate voltage of 0 V.

Photocurrent is a sensitive probe of the absorption information on a 2D semiconductor with a large signal-to-noise ratio, due to the large photocurrent response and negligible dark current. Some embodiments investigate the photocurrent response from the TMDC 10 as a function of the excitation photon energy. Some embodiments choose light excitation with a particular helicity ($\sigma^+$) to selectively excite a particular valley (K). As shown in FIGS. 2A-2B, even at the absence of an external magnetic field (0 T curve in FIG. 2B), the photocurrent response exhibits a resonance response at particular excitation photon energies. For example, in some embodiments, the most pronounced one is at 1.730 eV, the same as the absorption resonance of the 1 s state of the A exciton in WSe$_2$, and the second pronounced resonance peak is located at 1.861 eV, which is assigned as the 2 s state of the A exciton due to the agreement with the absorption spectra, as shown in FIG. 6A. In some embodiments, a third peak smaller in magnitude is visible at 1.880 eV and is the 3 s state of the A exciton, as discussed below. In some embodiments, increasing the magnitude of the out-of-plane magnetic field enhances the resonance at 3 s at a magnetic field of 15 T (−15 T), with an even higher-order excited exciton state, up to 8 s, being visible at 4.2 K, as shown in FIG. 2B. The detailed photocurrent spectra as a function of the excitation photon energy and magnetic field for the $\sigma^+$ photoexcitation (K valley) (i.e. the out-of-plane magnetic field) is shown in FIG. 2A, with all the resonance peaks (bright lines) exhibiting distinctive dependence on the magnetic field. The color represents the photocurrent magnitude, which is more pronounced as the excitation photon energy is in resonance with the 1 s state (1.725 eV) of the A exciton of the monolayer WSe$_2$. The resonance corresponding to the Rydberg series from 2 s to 8 s is visible on the right side of the chart. These dependencies are consistent with the expected absorption resonance for different exciton states, from 1 s to 8 s, as shown below. FIG. 2B shows the photocurrent response as a function of the excitation photon energy for the different magnetic fields, with measurements taken with 100 mV bias voltage and a temperature of 4.2 K. In some embodiments, the photocurrent spectra are taken at the zero gate voltage, when the WSe$_2$ is charge neutral. In some embodiments, all the resonance peaks quickly disappear when the gate voltage is changed to the electron or hole dope the WSe$_2$, as discussed below.

Figure 3A:
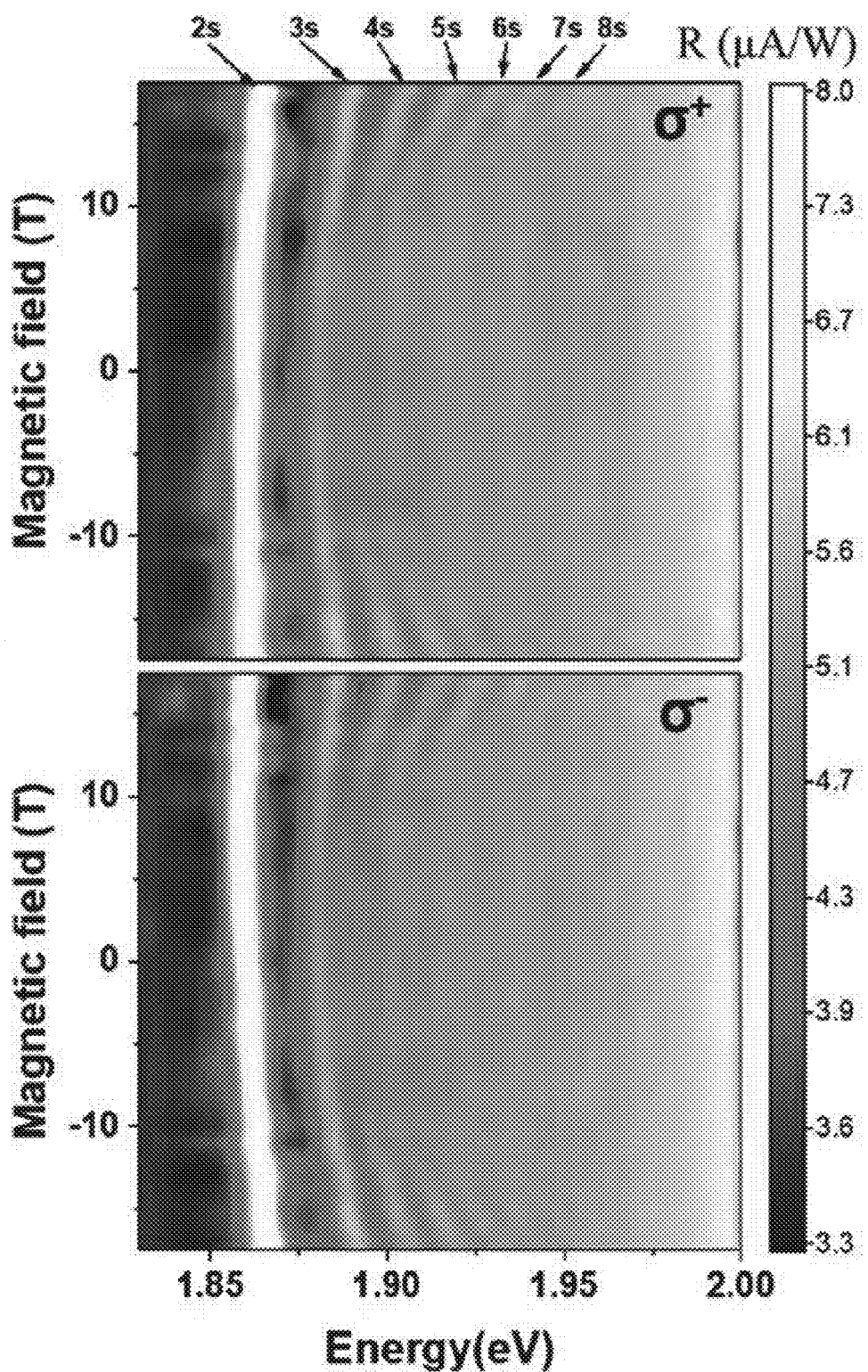
FIG. 3A is a chart showing the photocurrent responsivity of the TMDC as a function of the excitation photon energy and the magnetic field for the K valley (top) and K' valley (bottom).

In some embodiments, optical excitation with different helicities are used to access the photocurrent spectra of K and K' valleys, preferably focusing on the exciton excited state starting from 2 s. Some embodiments normalize the photocurrent with the excitation laser power, and the normalized photoresponsivity spectra is further background-subtracted, as shown in FIG. 3A, which shows the photocurrent spectroscopy of exciton Rydberg series of the TMDC 10 from the K valley (top chart) and the K' valley (bottom chart). As shown, starting from 3 s, the resonance peak position is approximately a quadratic function of the magnitude of the magnetic field B, significantly different from the 2 s. This distinct difference of the magnetic field is understood by considering the energy shift of Rydberg ("ns") exciton in the presence of the magnetic field. In the low-magnetic-field limit where Landau quantization does not need to be considered, the resonance energy for each ns exciton state, in some embodiments, is expressed as a function of the magnetic field as $$E_{ns} = E_{ns}^0 + \frac{1}{2}\sigma g \mu_B B + \Delta E_{dm} \tag{1}$$

where $E_{ns}^0$ is the energy of the ns state at zero magnetic field, $\sigma$ is the valley index that is +1 for the K valley and −1 for the K' valley, $\mu_B$ is the value of Bohr magnetic, and g is the Landé g-factor. The third term $\Delta E_{dm}$ is the diamagnetic shift. In the low-magnetic-field limit, where the cyclotron resonance energy $$\hbar \omega_B = \frac{e\hbar}{m_r}|B|$$

is much smaller than the exciton binding energy, the diamagnetic shift $\Delta E_{dm}$ is expressed as $$\frac{e^2}{8m_r}\langle r^2 \rangle_{ns} B^2,$$

with $m_r$ being the reduced mass of exciton and $\langle r^2 \rangle_{ns}$ being the square of the expected ns exciton radius. For ground-state 1 s, as the exciton is strongly bounded, $\langle r^2 \rangle_{1s}$ is small, and the energy shift $\Delta E = E_{ns} - E_{ns}^0$ is dominated by the valley-Zeeman term that linearly depends on the magnetic field. In some embodiments, even for the 2 s state, the linear term is still more significant, as shown in FIG. 3A. In contrast, for the higher-order excited state starting from 3 s, $\langle r^2 \rangle_{ns}$ increases significantly, and the diamagnetic shift term will dominate. Therefore, in such embodiments, the exciton energy shift is an approximately quadratic function of the magnetic field. The distinctive difference in the magnetic-field dependence for different ns states is evident in FIG. 3A.

In some embodiments, the Landau levels ("LL") will form in the extremely high-magnetic-field limit. If $$\frac{e\hbar}{m_r}|B|$$

is much larger than the binding energy, and the absorption is dominated by the inter-LL transitions, which is valley-selective due to the nontrivial Berry phase. The diamagnetic shift term $\Delta E_{dm}$ will be $$\left(n - \frac{1}{2}\right)\frac{e\hbar}{m_r}|B|,$$

where n is the number of allowed inter-LL transitions for each valley. As a result, the energy shift $\Delta E = E_{ns} - E_{ns}^0$ will again be a linear function of the magnetic field in the high-field limit. In some embodiments, as the binding energy of the high-order excited state decreases, the high-field limit is easier to achieve for the ns state when n>>1, as discussed below regarding data from the high-order excited state.

Figure 3B:
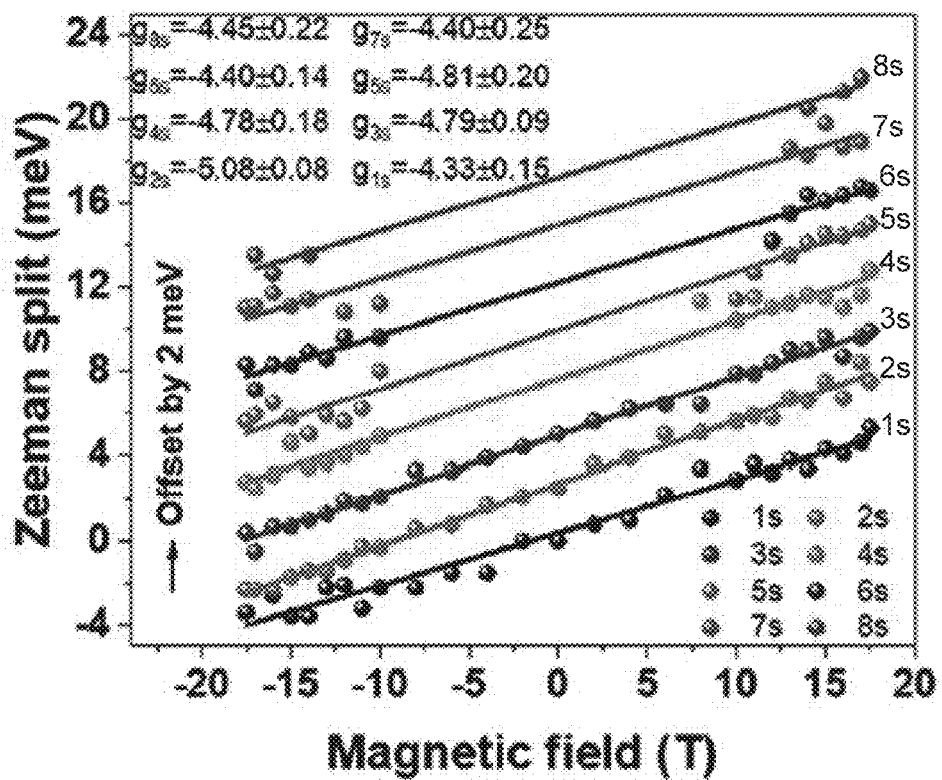
FIG. 3B is a chart showing the difference of the peak energy for different Rydberg excited states (Zeeman splitting) of the TMDC as a function of the magnetic field.

Equation 1 allows users to quantitatively analyze the experimental data. From the photocurrent spectra of the K and K' valleys (FIG. 3A), the energy difference of the resonance peaks $\Delta E = E_{ns} - E_{ns}^0$ is given by the expression of $$\frac{1}{2} g \mu_B B,$$

which is the valley-Zeeman shift for different excited exciton states. Thus, some embodiments extract the energy difference of the resonance for the K and K' valleys (FIG. 3A) for the exciton with the same principal number (n), and plot it as the function of the magnetic field, as shown in FIG. 3B. The resonance energy difference up to 8 s can all be well fitted with a linear fitting, which gives a g-factor in the range of about 4 to 5. The g-factor of the A exciton has been reported to be in this range for excited states up to 5 s. The present technology shows that the g-factor value of the 8 s is also similar. This insensitive dependence of the g-factor on the quantum principal number suggests that the Zeeman shift of the exciton mainly originates from the Zeeman shift of the band edges.

Also from Equation 1, the average energy of the resonance peaks from the photocurrent spectra of the K and K' valleys, $$\overline{E}_{ns} = \frac{1}{2}(E_K + E_{K'}),$$

can be expressed as $E_{ns}^0 + \Delta E_{dm}$, noting that $\Delta E_{dm}$ is an even function of the magnetic field, and the valley-Zeeman shift from K or K' valleys is an odd function of the magnetic field that cancels each other. As a result, the shift of the average resonance energy for ns, $\Delta \overline{E}_{ns} = \overline{E}_{ns} - E_{ns}^0$, will only be determined by the diamagnetic shift, and the experimentally extracted value is shown as the solid dots in FIG. 3C.

Figure 3C:
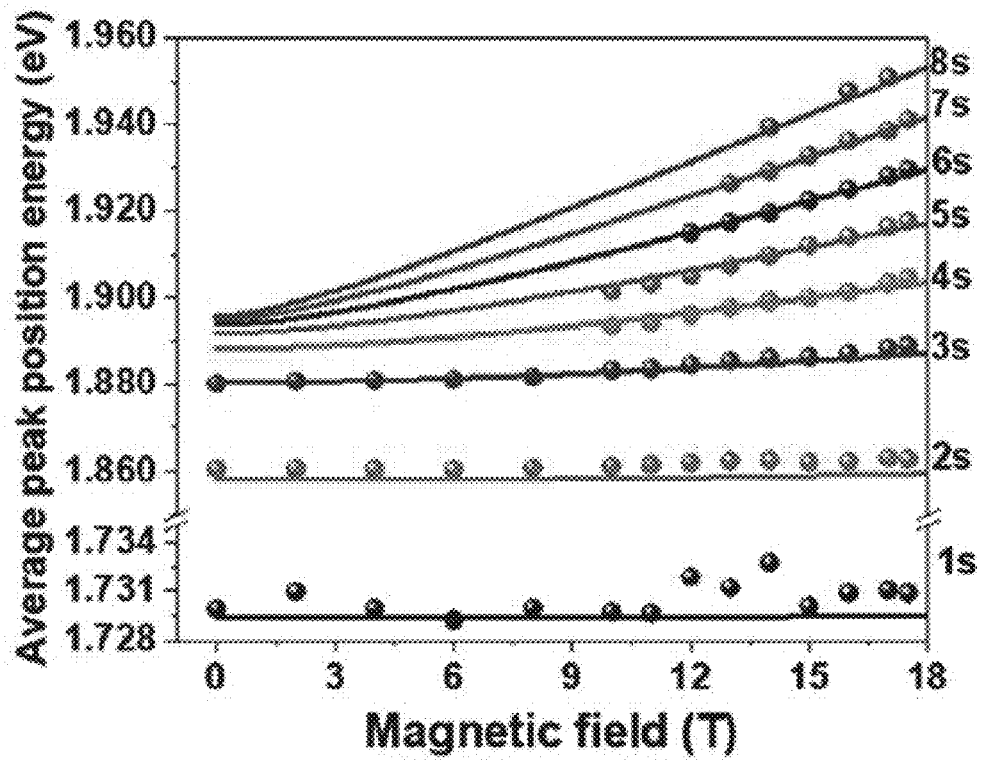
FIG. 3C is a chart showing the average of the peak energy for different Rydberg excited states at the K and K' valleys (Zeeman splitting) of the TMDC as a function of the magnetic field.

In some embodiments, the data represents a scenario where the strong Coulomb interaction and Landau quantization coexist, which gives rise to the intriguing question of the exciton behavior in a strong quantizing magnetic field. Since neither the Coulomb interaction nor the Landau quantization energy can be treated as a perturbation, an analytical solution is not shown. Instead, embodiments numerally calculate average resonance shift $\Delta \overline{E}_{ns}$ as a function of the magnetic field. Some embodiments adopt a non-hydrogenic screened Keldysh potential, which is given by $$V(r) = -\frac{e^2}{8\varepsilon_0 r_0}\left[H_0\left(\frac{\varepsilon r}{r_0}\right) - Y_0\left(\frac{\varepsilon r}{r_0}\right)\right] \quad (2)$$

where $\varepsilon = (\varepsilon_{top} + \varepsilon_{bottom})/2$ is the averaged relative dielectric constant of the surroundings, $\varepsilon_0$ is the vacuum permittivity, and $r_0 = 2\pi X_{2D}$ is the screening length with $X_{2D}$ being the 2D polarizability. $H_0$ and $Y_0$ are the Struve and Bessel functions of the second kind, respectively. The numerically calculated $\Delta \overline{E}_{ns}$ as a function of the magnetic field is, in some embodiments, best fitted with the experimental data with the fitting parameters $\varepsilon = 4.3$, $r_0 = 4.5$ nm, and $m_r = 0.2 m_0$, where $m_0$ is the free electron mass in a vacuum (see Supplemental Information 5 below). FIG. 3C shows that the numerical calculation is in excellent agreement with the experimental data for the exciton state from 2 s to 8 s.

In some embodiments, even high-order exciton excited states (n>8) are also vaguely visible in the color plots (FIG. 3A), especially for the magnetic field near −17 T. To extract this information, the valley degrees of freedom are preferably exploited to better subtract the background. As seen from Equation 1, the valley degrees of freedom help lift the energy degeneracy of the exciton states at the K and K' valleys. Hence, some embodiments define the polarization of the photocurrent as $$P_{PC} = \frac{PC_K - PC_{K'}}{PC_K + PC_{K'}},$$

where $PC_K$ ($PC_{K'}$) is the photocurrent response from the K (K') valley. If the separation of the resonances from the K and K' valleys is much larger than the line width of the resonance, the photocurrent valley polarization, $P_{PC}$, will have an extreme value of 50% for the K valley resonance and −50% valley resonance. In some embodiments, the line width broadens for the higher-order excited states, and the peak value of the photocurrent valley polarization becomes smaller, but the positive or negative peak is still useful to track the shift of the resonance of the K and K' valleys, as discussed below.

Figure 4A:
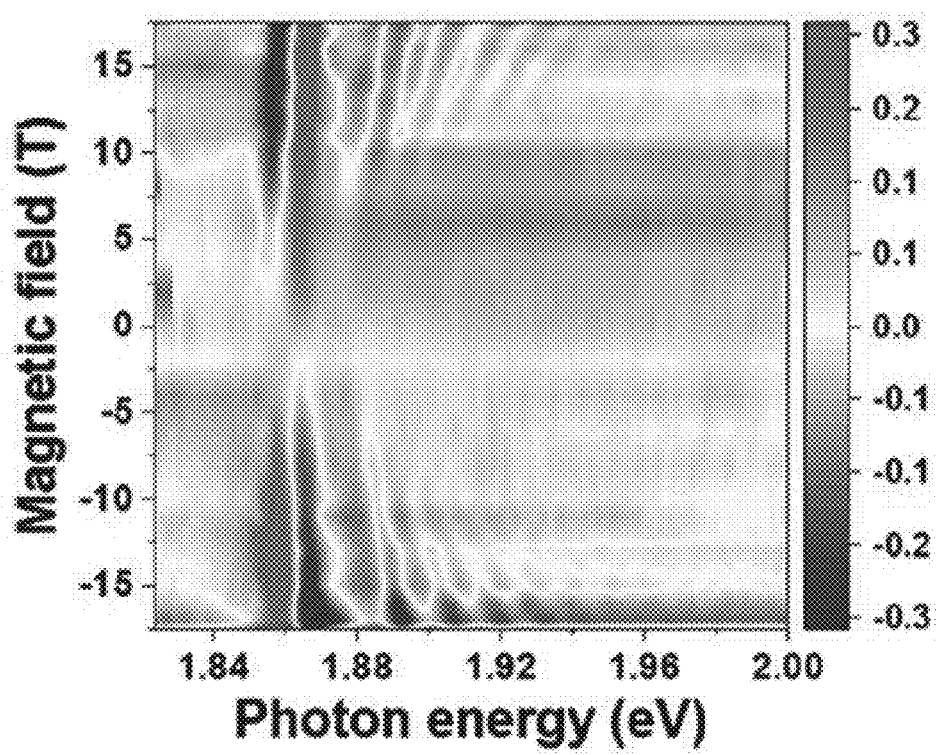
FIG. 4A is a chart showing the color plot of the photocurrent valley polarization of the TMDC as a function of the excitation photon energy and the magnetic field.
Figure 4B:
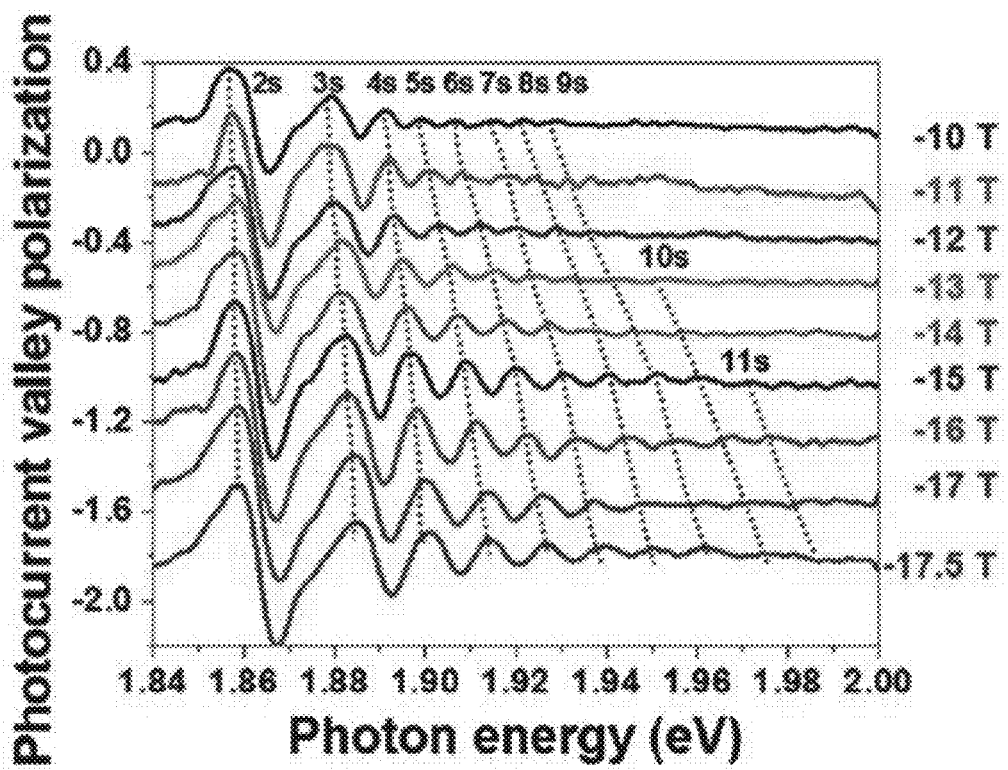
FIG. 4B is a chart showing the line traces of the photocurrent valley polarization of the TMDC for different magnetic fields.
Figure 4C:
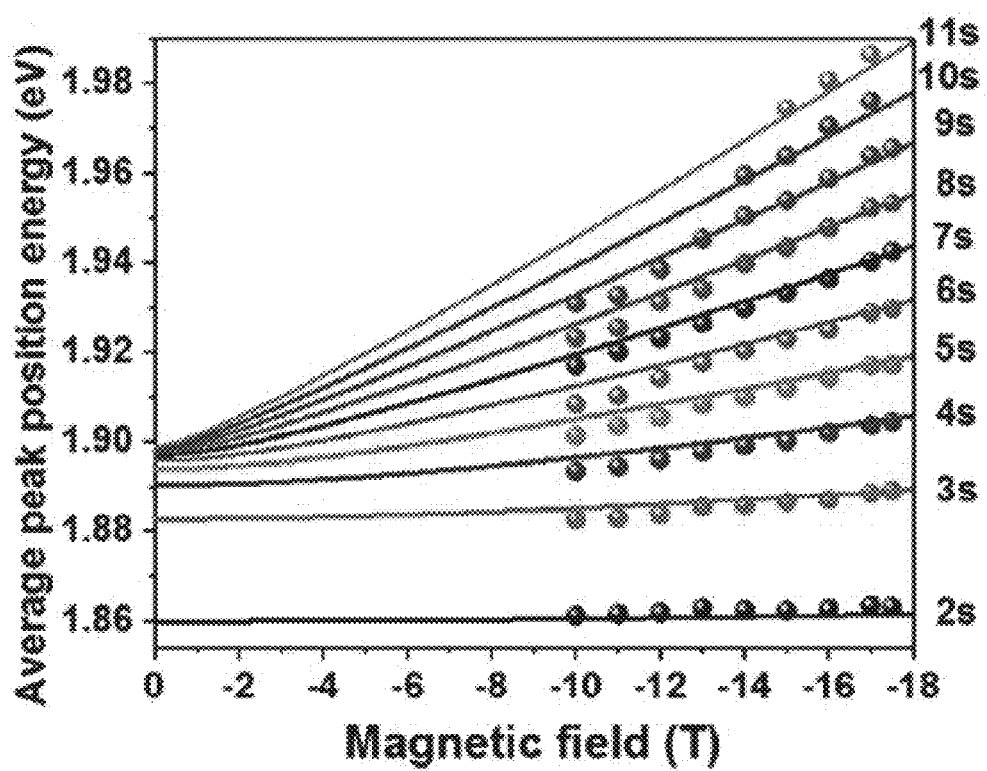
FIG. 4C is a chart showing the energy position of the node in FIG. 4A, where the photocurrent valley polarization is zero, as a function of the magnetic field.

FIG. 4A shows the experimentally extracted valley polarization as a function of the magnetic field. As shown, higher excited exciton state with the principal number n>8 is visible, especially for the magnetic field <−15 T. The valley polarization for different negative magnetic fields from −10 to −17.5 T is also found in the line traces shown in FIG. 4B which shows that the excited exciton states up to 11 s are identifiable. The dashed lines are the eye guide to track the peaks associated with different Rydberg excited states up to 11 s. The average resonance energy, which corresponds to the node of zero photocurrent valley polarization, is in excellent agreement with the numerical calculation, as shown in FIG. 4C, with the fitting parameters obtained in the discussion above ($\varepsilon = 4.3$, $r_0 = 4.5$ nm, and $m_r = 0.2 m_0$). Thus, some embodiments obtain the binding energy and radius extension for all the excited exciton states up to 11 s (Table 1). In some embodiments, the binding energy of 11 s exciton (1.2 meV) is significantly smaller than the Landau quantization energy $$\hbar \omega_B = \frac{e\hbar}{m_r}|B|$$

at 15 T (~8.69 meV), which suggests it is in the high-magnetic-field limit. As discussed above, in the high-field limit, the average energy shift will be a linear function of the B field, with the slope asymptotically approaching $$\left(n - \frac{1}{2}\right)\frac{e\hbar}{m_r}.$$

Therefore, some embodiments obtain the reduced mass of the exciton solely from experimental data. Fitting all Rydberg exciton data, starting from 9 s, reaches a saturating reduced mass of $0.2 m_0$ (as discussed below), that is in excellent agreement with fitting result mentioned above, confirming that it is in the high-field limit for n≥9 excitons even with a magnetic field as low as ~10 T.

Therefore, the TMDC 10 according to exemplary embodiments of the present technology provides an intriguing platform to investigate the different interplay between the Coulomb interaction and Landau quantization. By tuning the principal number n of Rydberg excitons, some embodiments smoothly transition from a low to high-magnetic-field limit with a reasonable magnetic field between about 10 to about 17 T, which is drastically advantageous for detailed investigations considering the extremely strong magnetic field (~91 T) needed previously.

Examples

In some embodiments, the TMDC 10 was fabricated by the dry transfer technique. First, the monolayer $WSe_2$ 12, few-layer graphene 20 and few-layer BN 14 were exfoliated onto $SiO_2$/Si substrate 15. A layer of 1 µm thick PPC on the transparent elastomer stamp (PDMS, polydimethylsiloxane) was inverted and attached to the transfer stage to pick up the few-layer BN flake. This process was repeated to pick up the monolayer $WSe_2$, few-layer graphene, and another few-layer BN in sequence. The prepared stack was placed onto a pair of pre-patterned gold ("Au") electrodes and removed the PPC by heating up to 90° C. The PPC residue was removed by chloroform to leave the BN/$WSe_2$/Graphene/BN stack on the substrate. Finally, another few-layer graphene was added onto the top BN as the top gate electrode, using the top BN flake as the gate dielectric layer.

Figure 5:
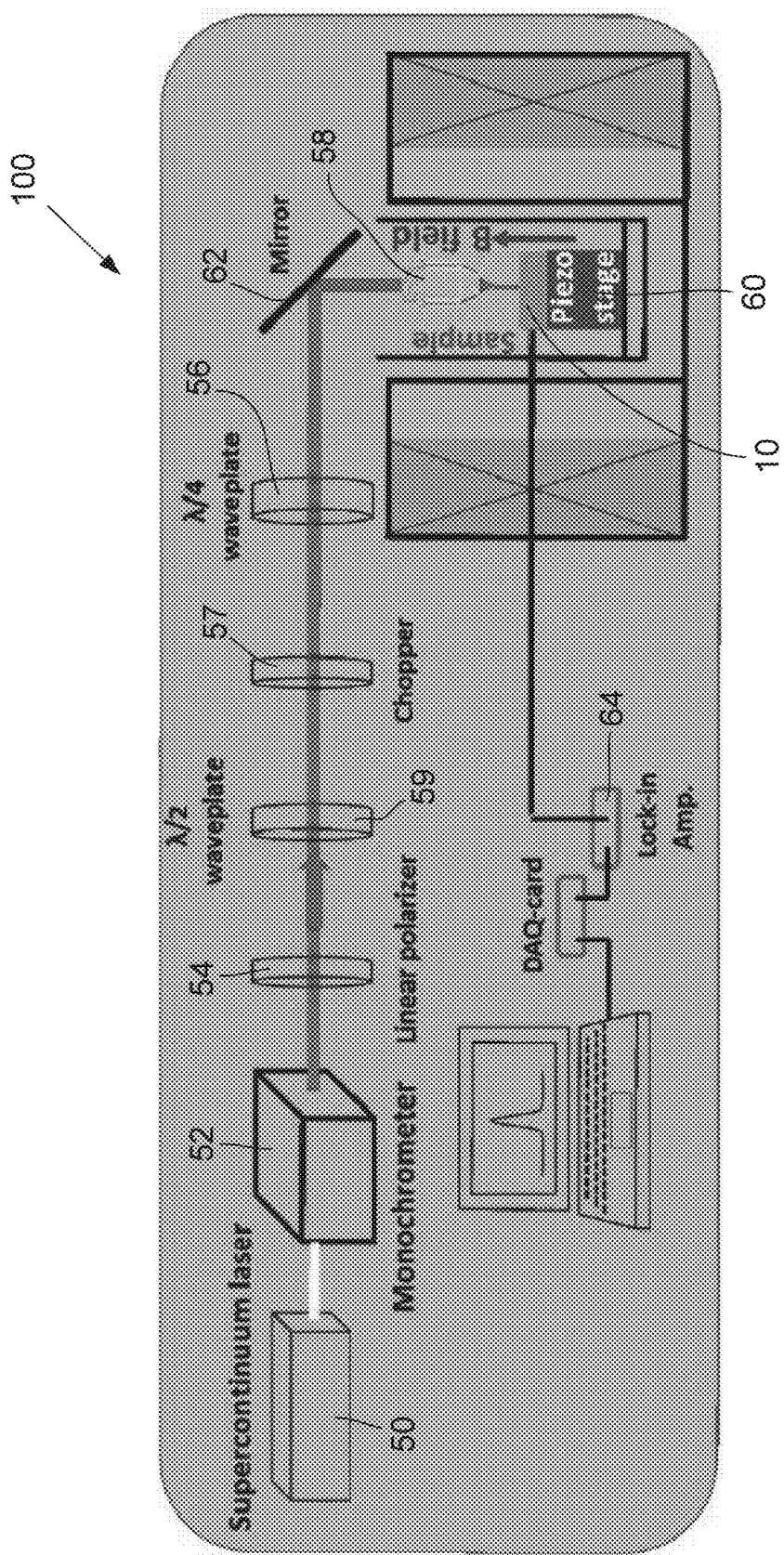
FIG. 5 is a schematic of the magneto-photocurrent system used on the TMDC according to an exemplary embodiment of the present technology.

In some embodiments, the photocurrent spectrum system 100 is shown in FIG. 5. The incident laser (e.g., NKT supercontinuum) 50 working as the broadband light source goes through a monochromator as a tunable filter 52, which selects and scans different wavelengths with the bandwidth of ~1 nm. The selected optical excitation of selected wavelength passes a linear polarizer 54, and then the linearly polarized light is converted into circularly polarized light by a quarter waveplate 56. The optical excitation is focused by a 50× objective 58 (NA: ~0.65) to a spot size of ~2 µm to excite the sample (e.g., the $WSe_2$ 12 of the TMDC 10), which is on a piezo stage microscope 60 and exposed to the external magnetic fields discussed above. In some embodiments, the optical excitation is redirected into the 50× objective 58 by one or more mirrors 62. A lock-in amplifier 64 was used to read out the photocurrent modulated by a mechanical chopper 57. In some embodiments, the system 100 further includes a half waveplate 59 positioned between the linear polarizer 54 and the mechanical chopper 57.

Figure 6B:
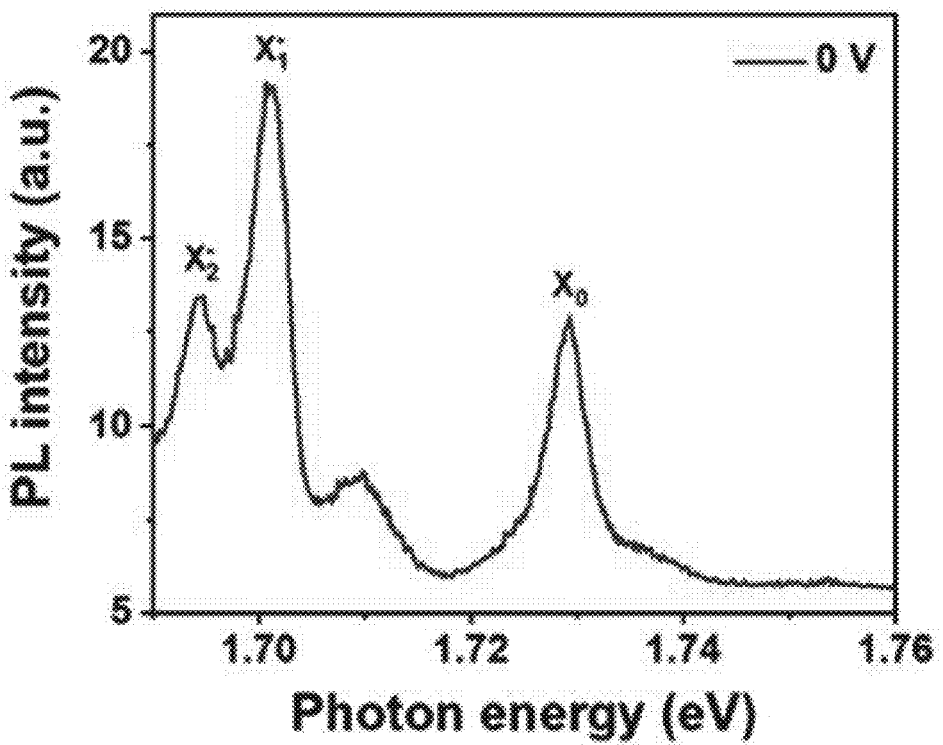
FIG. 6B is a chart showing the PL intensity of the TMDC at the gate voltage of 0 V.

FIG. 6A shows absorption spectra of the TMDC 10 at zero gate voltage, which shows the Is state of $WSe_2$ A exciton resonance at 1.7294 eV and 2 s state at 1.8579 eV. FIG. 6B shows PL spectra of the TMDC 10 at zero gate voltage, which shows the $WSe_2$ A exciton (1 s) resonance at 1.7293 eV. A CW laser centered at 690 nm with the power of 100 µW was used as the excitation for the PL measurement.

Figure 7A:
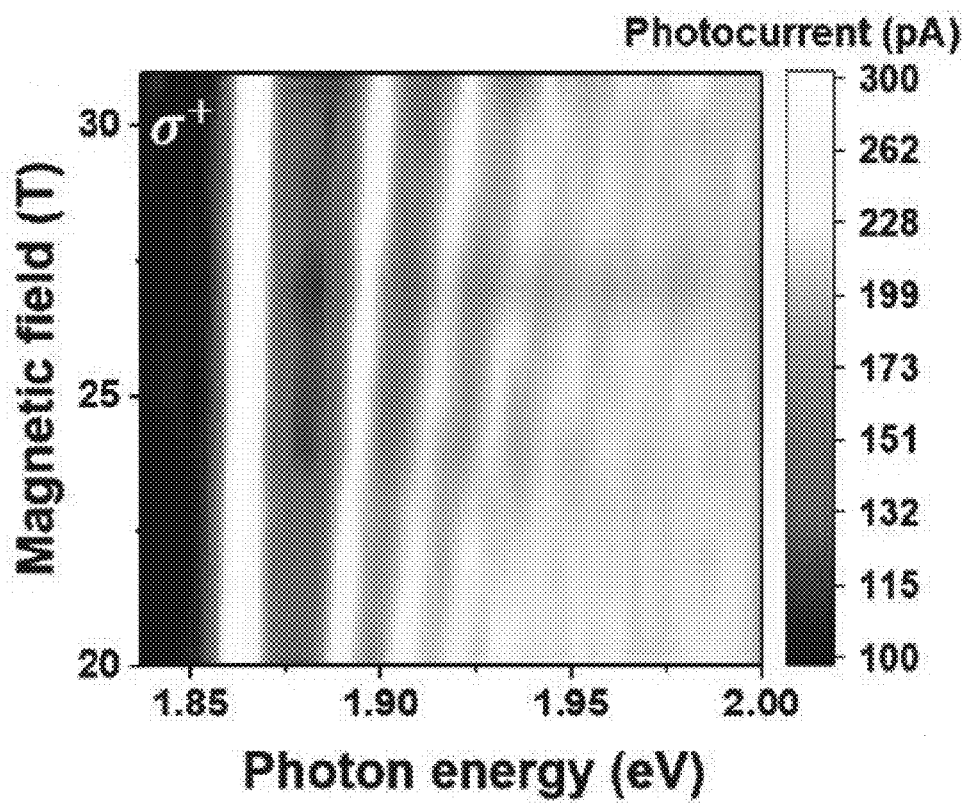
FIG. 7A is a chart showing the photocurrent response of the TMDC as a function of the excitation photon energy and the magnetic field for the K valley.
Figure 7B:
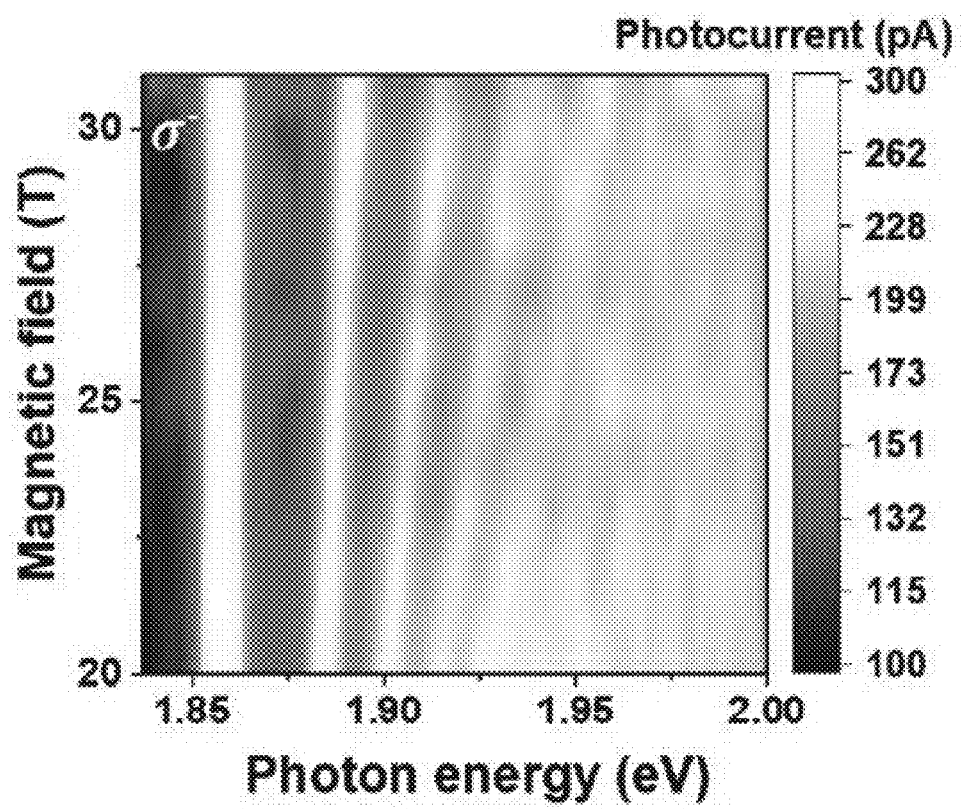
FIG. 7B is a chart showing the photocurrent response of the TMDC as a function of the excitation photon energy and the magnetic field for the K' valley.
Figure 7C:
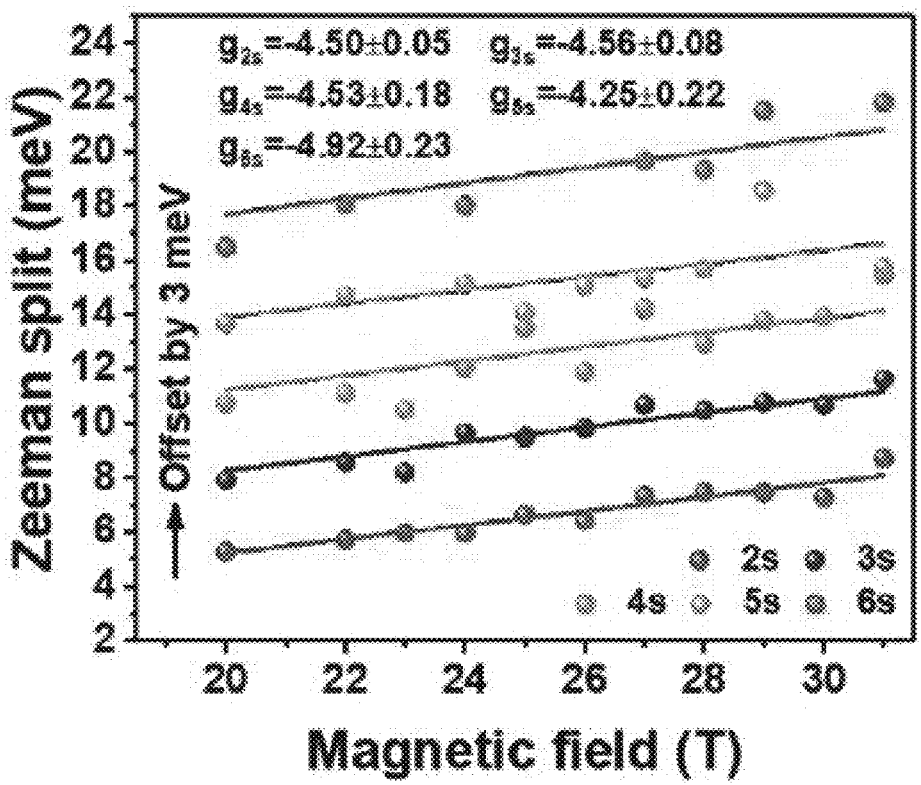
FIG. 7C is a chart showing the difference of the peak energy for different Rydberg exciton states (Zeeman splitting) of the TMDC as a function of the magnetic field.
Figure 7D:
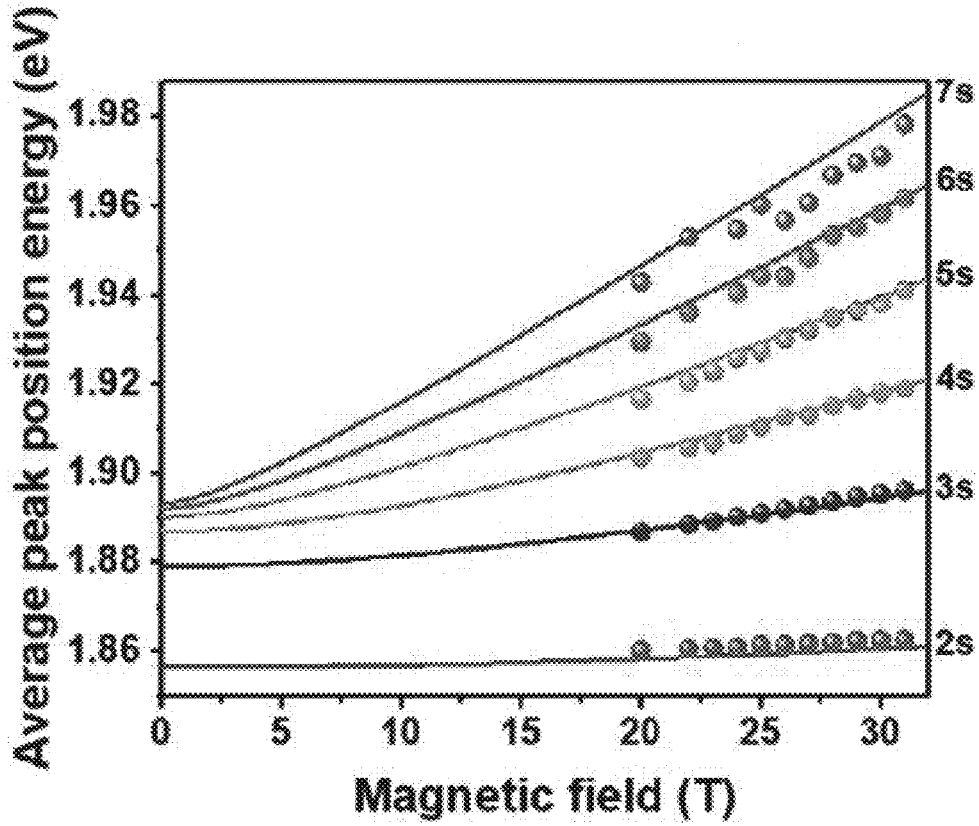
FIG. 7D is a chart showing the average of the peak energy for different Rydberg excited excitons at the K and K' valleys (diamagnetic shift) of the TMDC as a function of the magnetic field.

In some embodiments, magneto-photocurrent was performed at a higher magnetic field up to 31 T. The results are shown in FIGS. 7A-7D. The photocurrent response of the $\sigma^+$ and $\sigma^-$ configurations are respectively shown in FIGS. 7A-7B, which also clearly show the Rydberg series up to 7 s. However, due to possible current noise associated with the high applied magnetic field, the high order excited states appear to be not as obvious as what is discussed above. The extracted g-factor and resonance energy for different excited exciton states are shown in FIGS. 7C-7D, which are consistent with the results shown in FIG. 3 and discussed above.

Figure 8A:
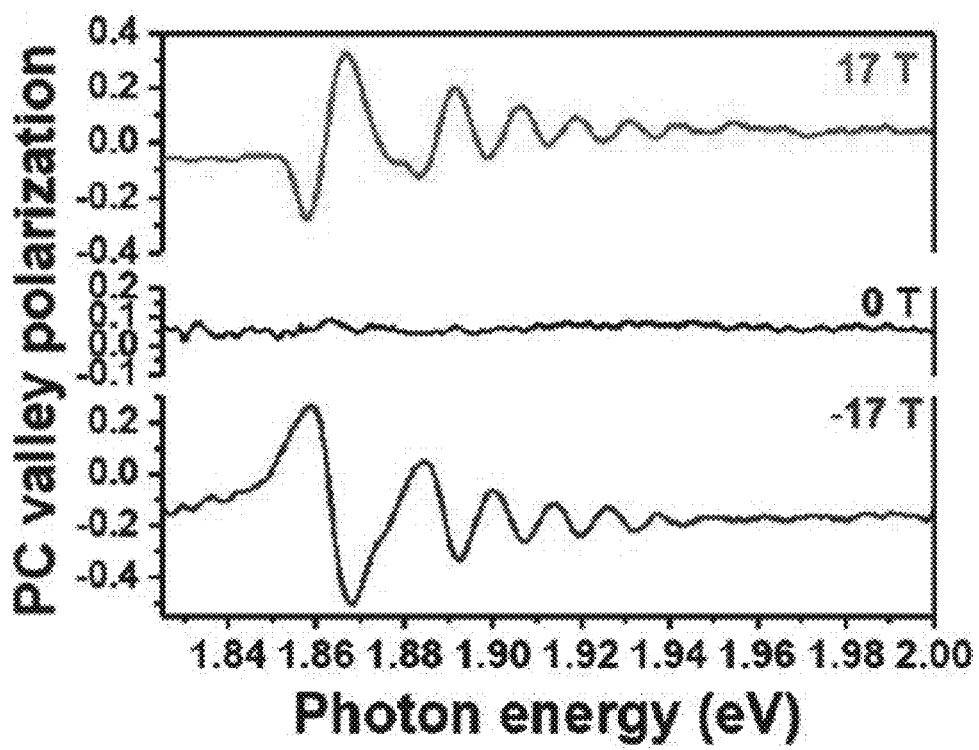
FIG. 8A is a chart showing the line cuts of photocurrent valley polarization of the TMDC for the magnetic fields of −17 T, 0 T, and 17 T.
Figure 8B:
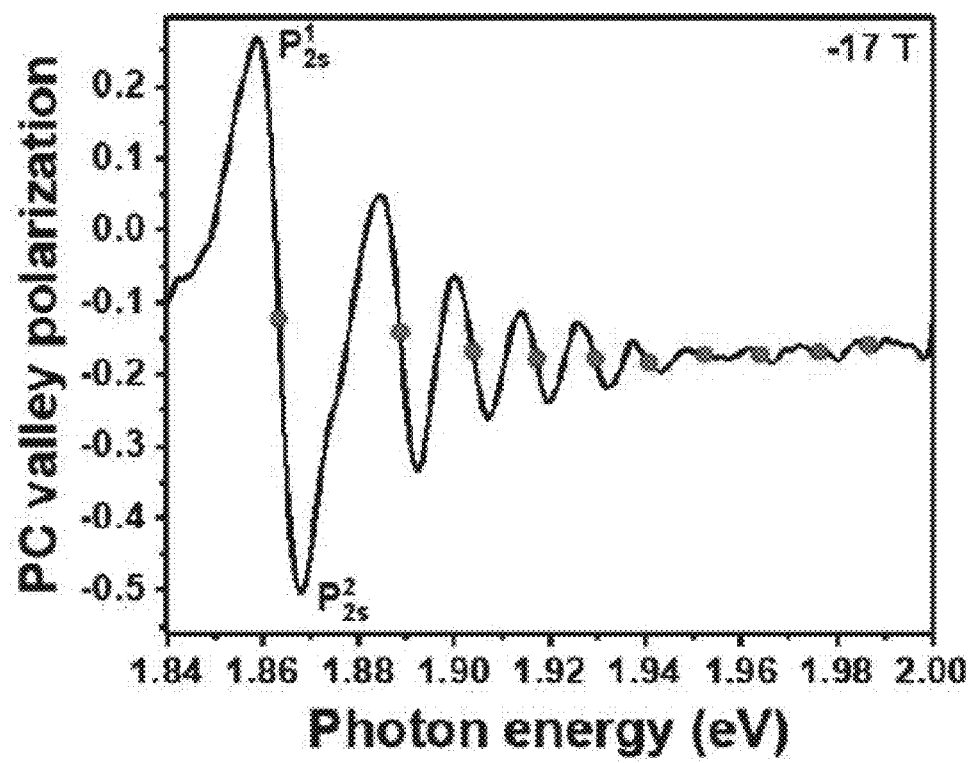
FIG. 8B is a chart showing the photocurrent valley polarization of the TMDC under the magnetic field of −17 T.

In some embodiments, the determination of the average resonance energies for each Rydberg exciton in FIG. 4C is described briefly as follows. FIG. 8A shows the line cuts of photocurrent valley polarization for the magnetic fields of −17 T, 0 T, and 17 T. FIG. 8B shows the photocurrent valley polarization under the magnetic field of −17 T. Taking 2 s as an example, the average resonance energy $$\overline{E_{2s}} = (P_{2s}^1 + P_{2s}^2)/2,$$

where $P_{2s}^1$ and $P_{2s}^2$ are the peak and dip of the oscillation of the excited state 2 s, as shown in FIG. 8B, in which the solid circles represent the average resonance energies for each excited state from 2 s to 11 s.

In some embodiments, to solve the 2D magnetoexciton problem, the Zeeman shift of the bands are ignored, and the exciton effective-mass approximation method is adopted. The Hamiltonian for an electron and a hole in $WSe_2$ in a perpendicular magnetic field is given by $$H = \frac{(-i\hbar\nabla_e + eA_e)^2}{2m_e} + \frac{(-i\hbar\nabla_h - eA_h)^2}{2m_h} + V(r_e - r_h) \quad (3)$$

Some embodiments use the symmetric gauge $A_{e(h)} = B(\hat{z} \times r_{e(h)})/2$. The Hamiltonian of the relative motion (exciton) is given by $$H = -\frac{\hbar^2}{2m_r}\nabla_r^2 + \frac{e^2}{8m_r}B^2r^2 + V(r) \quad (4)$$

where $r = r_e - r_h$ is the relative coordinate and $m_r$ is the reduced mass. While there is no analytical solution for this problem, the eigenstates and eigenenergy can be obtained numerically by expanding the wavelength $$\varphi_{n,m} = \frac{1}{N_{n,m}} J_m(k_n^m r/R) e^{im\theta},$$

m=0, ±1, ±2, . . . is the quantum number of angular momentum, $k_n^m$ is the nth zero point of the first kind of Bessel functions $J_m(x)$, $N_{n,m} = \sqrt{\pi}R J_{m+1}(k_n^m)$, where R is the radial cutoff with the boundary condition $\Phi(R)=0$. The angular momentum $\hat{L}_z$ is conserved and m is a good number. Therefore, the Hamiltonian is blocked diagonalized labeled by the angular momentum. Some embodiments are only interested in the s states, i.e., m=0. The eigenvalue equation is written as $$\sum_{n'}\left[\frac{\hbar^2}{2m_r}\left(\frac{k_{n'}^0}{R}\right)^2 \delta_{n,n'} + U_{n,n'}\right]C_{n',0} = EC_{n,0} \quad (5)$$

The potential matrix elements $$U_{n,n'} = \int_0^R \frac{2\pi}{N_{n,0}N_{n',0}} J_0(k_n^0 r/R) U(r) J_0(k_{n'}^0 r/R) r dr,$$

where $$U(r) = V(r) + \frac{e^2}{8m_r}B^2r^2$$

and the Coulomb potential is the non-hydrogenic Keldysh potential $$V(r) = -\frac{e^2}{8\varepsilon_0 r_0}\left[H_0\left(\frac{\varepsilon r}{r_0}\right) - Y_0\left(\frac{\varepsilon r}{r_0}\right)\right] \quad (6)$$

where $$\varepsilon = \frac{\varepsilon_{top} + \varepsilon_{bottom}}{2}$$

is the averaged relative dielectric constant of surrounding, $r_0 = 2\pi\chi_{2D}$ is the screening length and $\chi_{2D}$ is the 2D polarizability. $H_0$ and $Y_0$ are the Struve and Bessel functions of the second kind, respectively.

In the calculation, $\varepsilon$, $m_r$, and $r_0$ are three material parameters. In some embodiments, for each set of parameters, the energy vs magnetic field curve for 1 s to 11 s excited states are calculated. Then, the whole parameter space is searched to minimize the total error between the calculation and experiment. Some embodiments adopted 1200 basis functions with the radial cutoff R=500 nm. Then, some embodiments, determined that $\varepsilon$=4.3, $r_0$=4.5 nm, and $m_r$=0.2$m_0$ are the best fitting parameters.

In 2D materials, the magnetic length is usually far larger than the Bohr radius (exciton size) due to the reduced screening effect when the magnetic field is not strong. Then the magnetic field term $$\frac{e^2}{8m_r}B^2 r^2$$

can be regarded as a perturbation term. The energy of Rydberg states will acquire a diamagnetic shift in the presence of magnetic field, i.e., $$\Delta E_{ns} = \frac{e^2 B^2}{8m_r}\langle r^2\rangle_{ns} = \sigma_{ns} B^2.$$

Figure 9A:
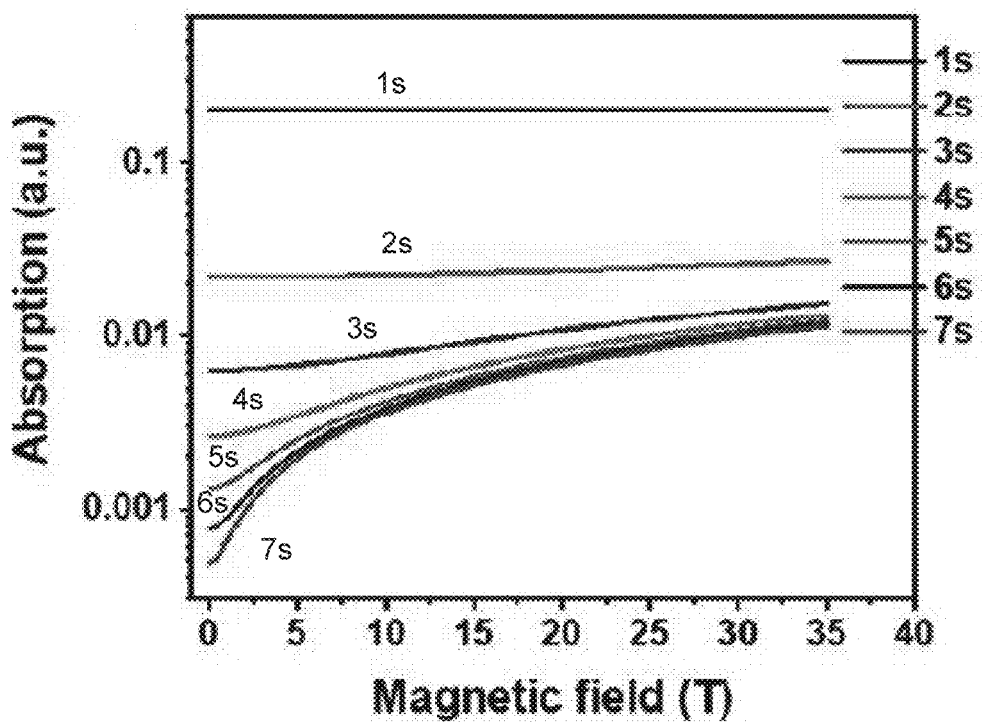
FIG. 9A is a chart showing the calculated relative absorption of different exciton states of the TMDC under a magnetic field.
Figure 9B:
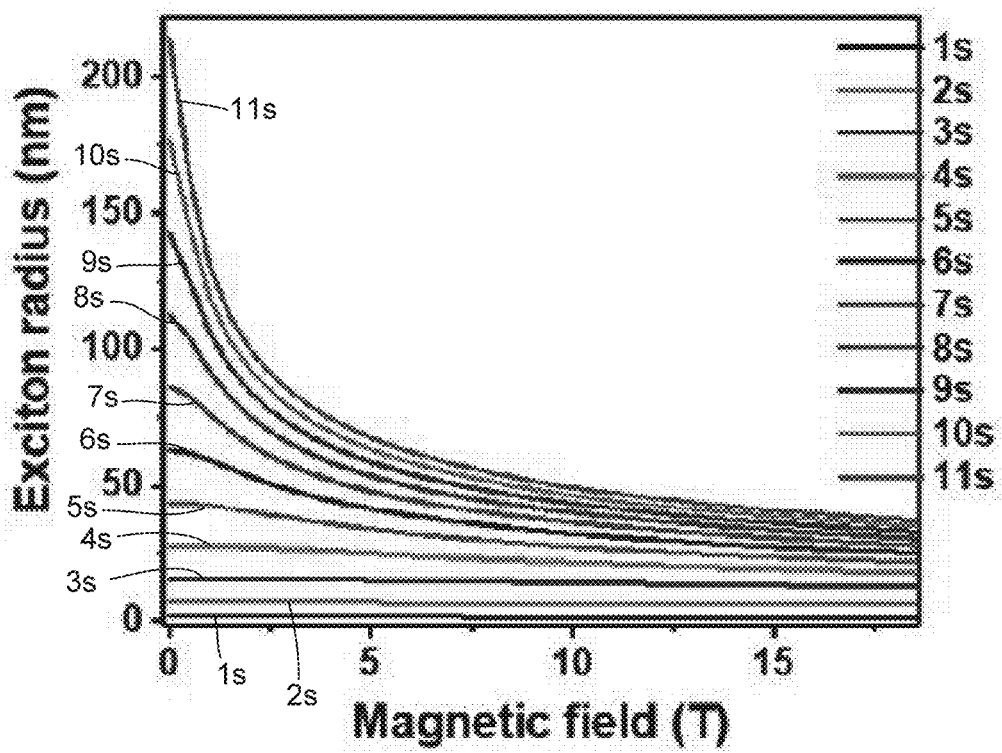
FIG. 9B is a chart showing the calculated radius of different excited states of the TMDC under a magnetic field.

Some embodiments define $r_{ns} = \sqrt{\langle r^2\rangle_{ns}}$. FIG. 9B shows the radius vs magnetic field curve plotted with the fitting parameters. The absorption of excited states of exciton is proportional to $|\Phi_i(r=0)|^2$, which is shown in FIG. 9A. In the plot, the magnetic squeezing effect of exciton to reduce the radius and the magnetic brightening of exciton is observed.

Figure 10A:
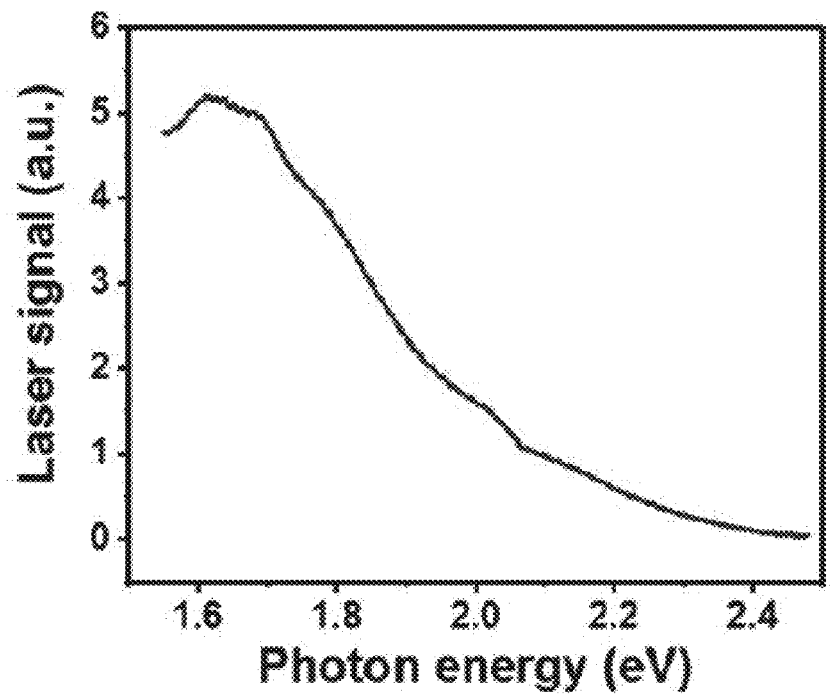
FIG. 10A is a chart showing the original laser output measured by a photodetector for the system of FIG. 5.
Figure 10B:
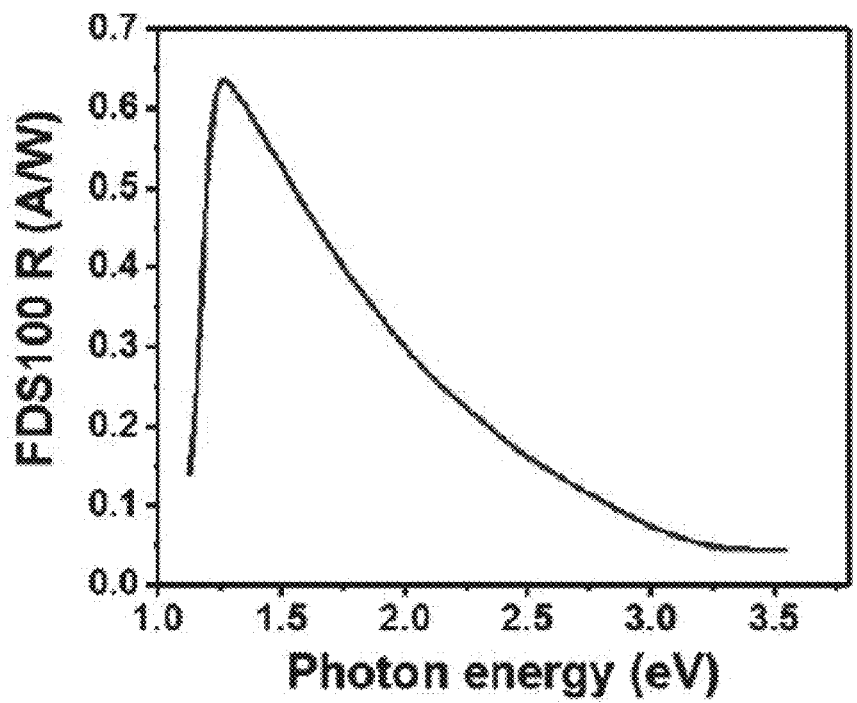
FIG. 10B is a chart showing the responsivity of the calibrated photodetector for the system of FIG. 5.
Figure 10C:
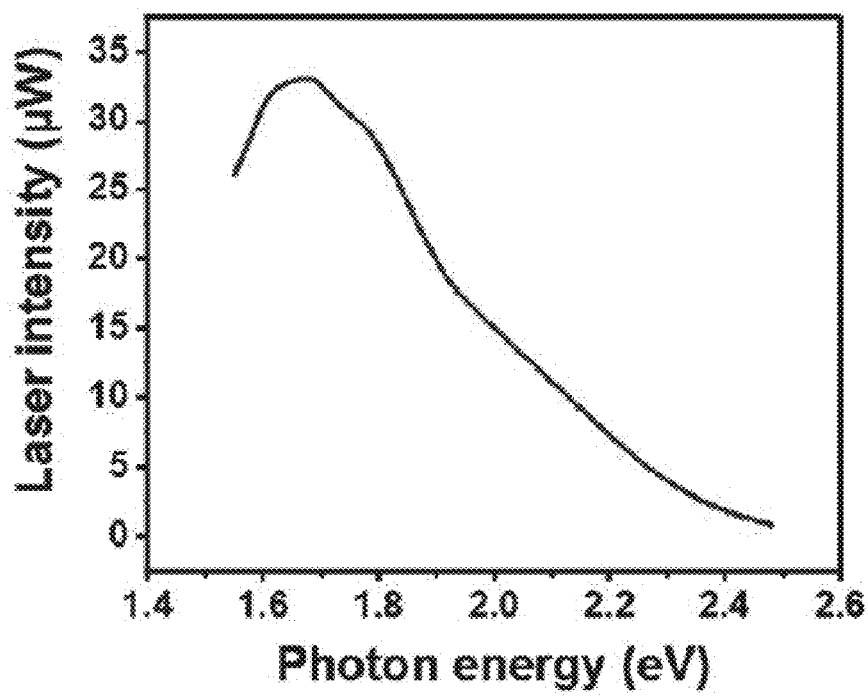
FIG. 10C is a chart showing the calibrated laser output power for the system of FIG. 5 used in exemplary photocurrent spectroscopy experiments discussed herein.

In some embodiments, the supercontinuum laser output was measured by a photodetector, as shown in FIG. 10A. As the responsivity of the photodetector is known (FIG. 10B), the output power of the laser as a function of the photon energy was obtained, as shown in FIG. 10C. It is worth noting that the laser spectrum is smooth in the interested photon energy range.

Figure 11:
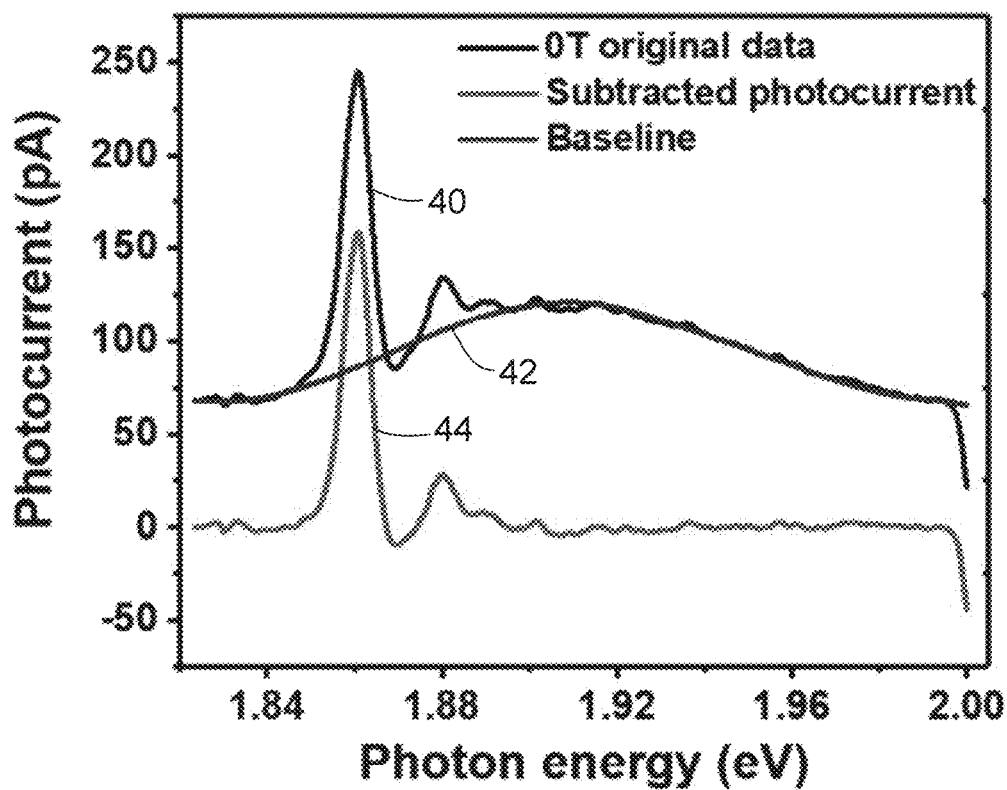
FIG. 11 is a chart showing an exemplary photocurrent background subtraction.

As the laser spot drifts for different magnetic fields, the baseline of the photocurrent spectroscopy fluctuates. To better resolve the excited exciton state peak, some embodiments subtract the baseline of each photocurrent spectrum. In some embodiments, 10 points from the interval 1.82 to 1.84 and 1.9 to 2.0 eV were chosen to generate a baseline with a B-spline interpolation method. FIG. 11 shows the photocurrent background subtraction, with the 0 T original data (curve labeled 40), baseline (curve labeled 42), and subtracted photocurrent (curve labeled 44).

As discussed above, in the high magnetic field limit in some embodiments, the average resonance energy shift will be a linear function of the B field, with the slope asymptotically approaching $$\left(n-\frac{1}{2}\right)\frac{e\hbar}{m_r}.$$

Figure 12:
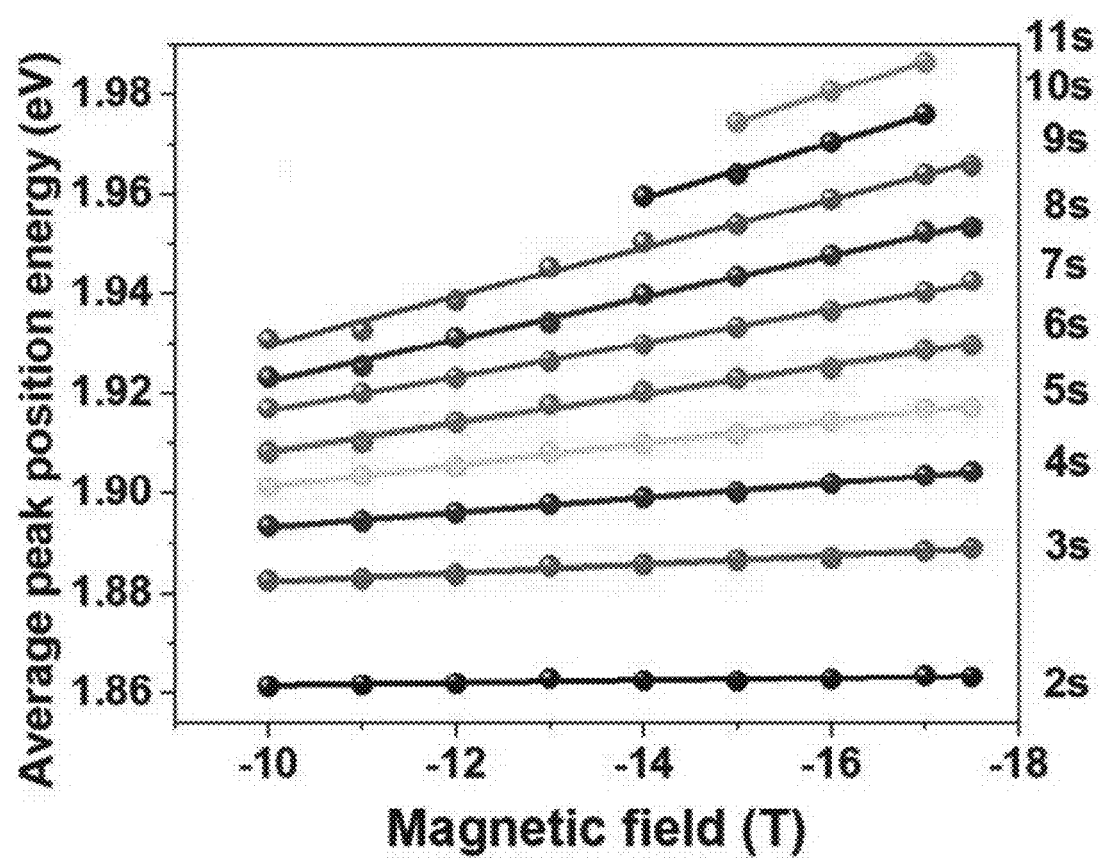
FIG. 12 is a chart showing the linear fitting of the average resonance energy shifts of different Rydberg excitons of the TMDC.

Thus, a linear fitting of the average energy of excited states from experimental data was performed to extract the reduced mass $m_r$. From the calculation, the slope of diamagnetic shift $\Delta E_{dm}$ will increase gradually and converge to $$\left(n-\frac{1}{2}\right)\frac{e\hbar}{m_r},$$

thus obtaining an upper bound of the effective mass. The results are shown in FIG. 12 and Table 2 below, which shows that the reduced mass approaches a saturating value of 0.2 $m_0$, where $m_0$ is the free electron mass. The results suggest that from state 9 s, even magnetic field ~10-17 T brings the system to the high magnetic field limit.

TABLE 2

Reduced mass extracted from linear slope fitting

| Excited States | Reduced Mass ($m_0$) |
|---|---|
| 2s | 0.705 ± 0.036 |
| 3s | 0.335 ± 0.011 |
| 4s | 0.276 ± 0.004 |
| 5s | 0.240 ± 0.004 |
| 6s | 0.220 ± 0.005 |
| 7s | 0.223 ± 0.003 |
| 8s | 0.208 ± 0.005 |
| 9s | 0.202 ± 0.006 |
| 10s | 0.198 ± 0.010 |
| 11s | 0.203 ± 0.003 |

Figure 13A:
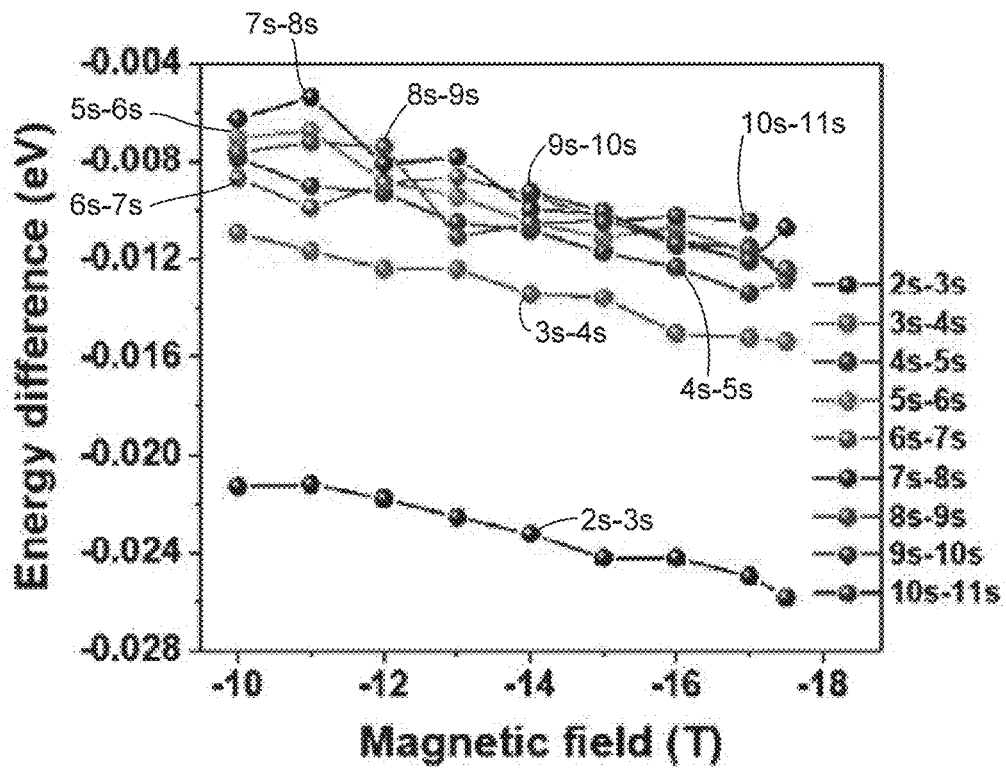
FIG. 13A is a chart showing the energy difference calculation between adjacent excited states of the TMDC.
Figure 13B:
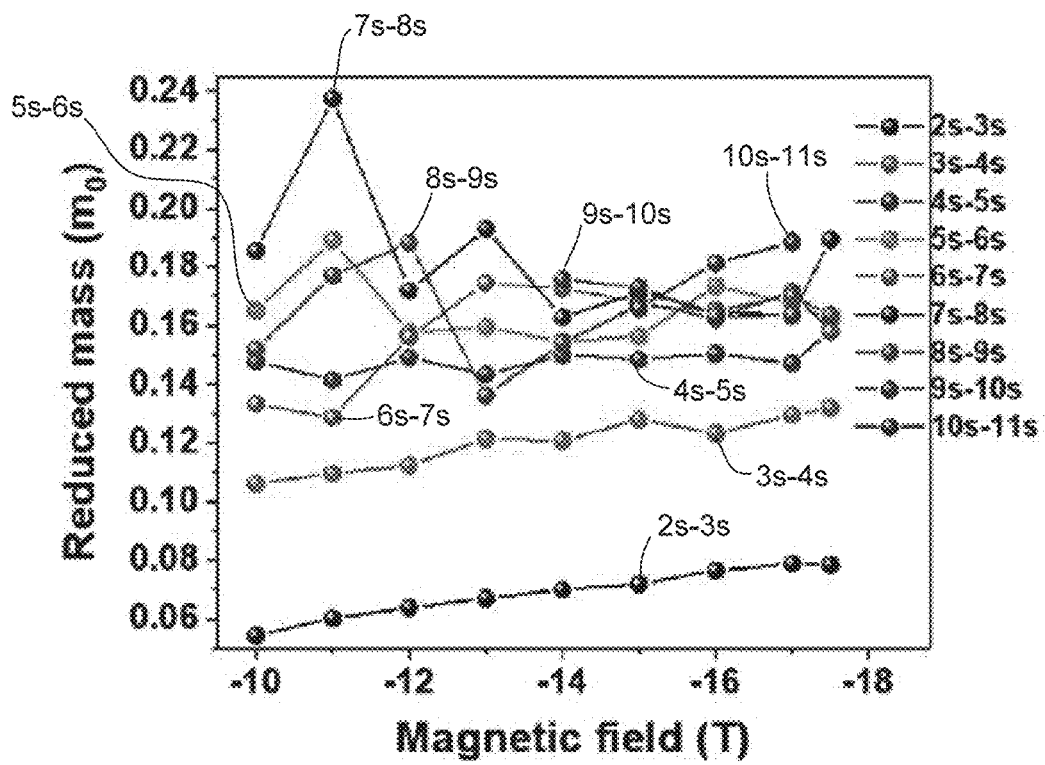
FIG. 13B is a chart showing the reduced mass extraction from the energy difference of FIG. 13A.

From the calculation, the energy difference of adjacent excited states at the same magnetic field will decrease to $$\frac{e\hbar}{m_r}$$

gradually as the magnetic field increases. An upper bound of the effective mass is obtained, in some embodiments, by assuming the high magnetic field approximation. Results are shown in FIGS. 13A-13B and Table 3 below.

TABLE 3

Average reduced mass extracted from the calculated resonance energy difference

| Excited States | Average Reduced Mass ($m_0$) |
|---|---|
| 2s-3s | 0.069 |
| 3s-4s | 0.120 |
| 4s-5s | 0.148 |
| 5s-6s | 0.165 |
| 6s-7s | 0.158 |
| 7s-8s | 0.175 |
| 8s-9s | 0.164 |

TABLE 3-continued

Average reduced mass extracted from the
calculated resonance energy difference

| Excited States | Average Reduced Mass ($m_0$) |
|---|---|
| 9s-10s | 0.169 |
| 10s-11s | 0.179 |

Figure 14:
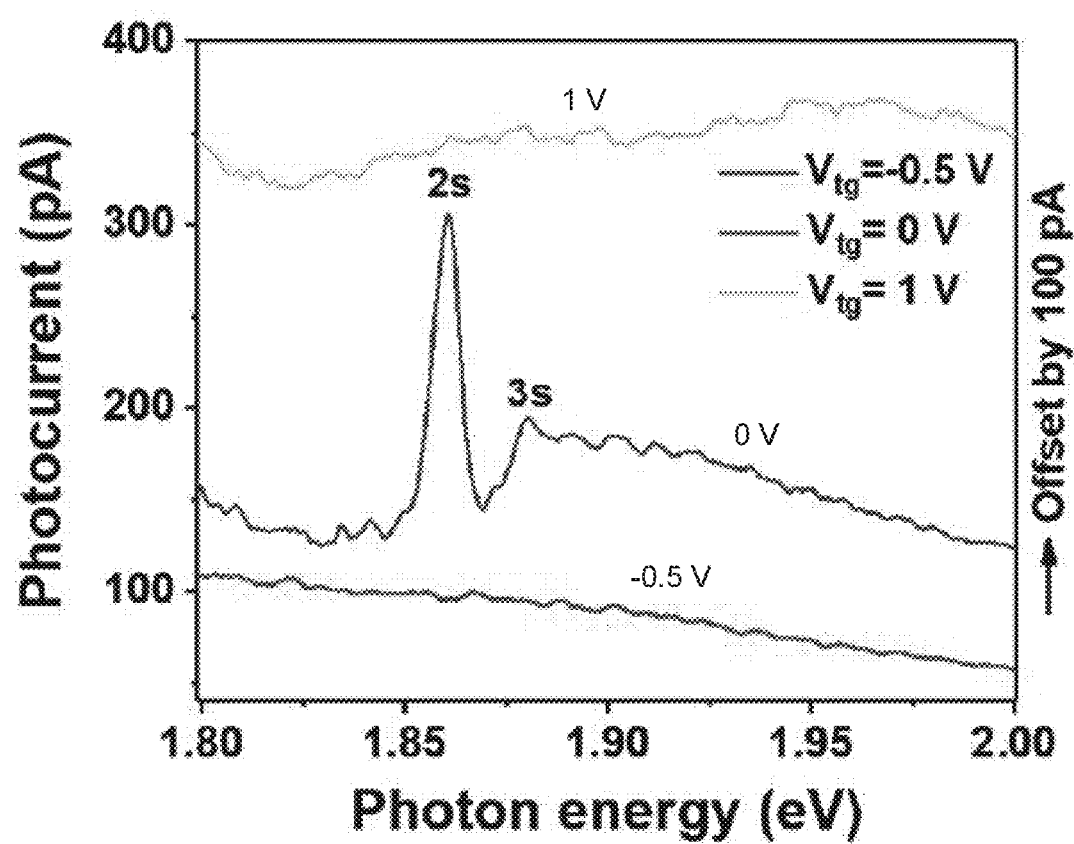
FIG. 14 is a chart showing the gate dependence of the photocurrent spectra of the TMDC.

In some embodiments, the photocurrent spectra under different top gate voltages were measured. The excited states only appear in the intrinsic region, as shown in FIG. 14.

Although the technology has been described and illustrated with respect to exemplary embodiments thereof, it should be understood by those skilled in the art that the foregoing and various other changes, omissions, and additions may be made therein and thereto, without parting from the spirit and scope of the present technology.

What is claimed is:

1. A transition metal dichalcogenides device comprising:
 a substrate;
 at least one layer of boron nitride;
 a tungsten diselenide monolayer positioned such that the at least one layer of boron nitride at least partially encapsulates the tungsten diselenide monolayer; and
 a plurality of electrodes comprising:
  a source electrode positioned on the substrate;
  a drain electrode positioned on the substrate; and
  a top gate electrode positioned on a top layer of the at least one layer of boron nitride.

2. The device of claim 1, wherein each of the source electrode, drain electrode, and top gate electrode comprise gold and few-layer graphene.

3. The device of claim 1, wherein the at least one layer of boron nitride comprises hexagonal few-layer boron nitride.

4. The device of claim 1, wherein the substrate comprises at least one of a silicon dioxide layer and a silicon layer.

5. The device of claim 1, wherein the tungsten diselenide monolayer is configured to reveal excitons when at least one of a K valley and a K' valley of the tungsten diselenide monolayer is exposed to excitation photon energy and an external magnetic field.

6. The device of claim 5, wherein the excitons are giant valley-polarized Rydberg excitons in excited states ranging from 2 s to 11 s when the external magnetic field is in the range of about −17 T to about 17 T.

7. A system for revealing excitons in a transition metal dichalcogenides comprising:
 a broadband light source configured to emit excitation photon energy;
 a tunable filter configured to filter the excitation photon energy to a predetermined wavelength bandwidth;
 a linear polarizer configured to linearly polarize the filtered excitation photon energy; and
 a quarter waveplate configured to convert the linearly polarized excitation photon energy into circularly polarized excitation photon energy to excite the transition metal dichalcogenides.

8. The system of claim 7, wherein an external magnetic field is applied to the transition metal dichalcogenides when it is exposed to the focused circularly polarized excitation photon energy.

9. The system of claim 7, further comprising a half waveplate positioned between the linear polarizer and the quarter waveplate.

10. The system of claim 9, further comprising a mechanical chopper positioned between the half waveplate and the quarter waveplate.

11. The system of claim 7, wherein the broadband light source comprises a supercontinuum laser.

12. The system of claim 7, further comprising a focusing element configured to focus the circularly polarized excitation photon energy to excite the transition metal dichalcogenides.

13. The system of claim 7, wherein the predetermined wavelength bandwidth is about 1 nm.

14. The system of claim 7, wherein the transition metal dichalcogenides comprises:
 a substrate;
 at least one layer of boron nitride;
 a tungsten diselenide monolayer positioned such that the at least one layer of boron nitride at least partially encapsulates the tungsten diselenide monolayer; and
 a plurality of electrodes.

15. The system of claim 14, wherein the tungsten diselenide monolayer is configured to reveal excitons when at least one of a K valley and a K' valley of the tungsten diselenide monolayer is exposed to the focused circularly polarized excitation photon energy and the external magnetic field.

16. The system of claim 15, wherein the excitons are giant valley-polarized Rydberg excitons in excited states ranging from 2 s to 11 s when the external magnetic field is in the range of about −17 T to about 17 T.

17. A method of revealing excitons in a transition metal dichalcogenides comprising:
 providing the transition metal dichalcogenides, the transition metal dichalcogenides comprising:
  a substrate;
  at least one layer of boron nitride;
  a tungsten diselenide monolayer positioned such that the at least one layer of boron nitride at least partially encapsulates the tungsten diselenide monolayer; and
  a plurality of electrodes;
 exposing the transition metal dichalcogenides to an external magnetic field;
 emitting excitation photon energy from a broadband light source;
 filtering, via a tunable filter, the excitation photon energy to a predetermined wavelength bandwidth;
 linearly polarizing, via a linear polarizer, the filtered excitation photon energy;
 converting, via a quarter waveplate, the linearly polarized excitation photon energy to circularly polarized excitation photon energy; and
 focusing, via a focusing element, the circularly polarized excitation photon energy onto the tungsten diselenide monolayer of the transition metal dichalcogenides.

18. The method of claim 17, wherein the tungsten diselenide monolayer is configured to reveal excitons when at least one of a K valley and a K' valley of the tungsten diselenide monolayer is exposed to the focused circularly polarized excitation photon energy and the external magnetic field.

19. The method of claim 18, wherein the excitons are giant valley-polarized Rydberg excitons in excited states ranging from 2 s to 11 s when the external magnetic field is in the range of about −17 T to about 17 T.

* * * * *